US012765092B2

(12) United States Patent
Moon et al.

(10) Patent No.: US 12,765,092 B2
(45) Date of Patent: Oct. 13, 2026

(54) IMAGE SENSOR HAVING A REDUCED LENGTH METAL WIRING CONNECTING FLOATING DIFFUSION REGIONS

(71) Applicant: SAMSUNG ELECTRONICS CO., LTD., Suwon-si (KR)

(72) Inventors: Sanghyuck Moon, Suwon-si (KR); Jueun Park, Suwon-si (KR); Hyuncheol Kim, Suwon-si (KR); Eunsub Shim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 297 days.

(21) Appl. No.: 18/408,834

(22) Filed: Jan. 10, 2024

(65) Prior Publication Data

US 2024/0243142 A1 Jul. 18, 2024

(30) Foreign Application Priority Data

Jan. 13, 2023 (KR) ........................ 10-2023-0005527

(51) Int. Cl.
*H10F 39/00* (2025.01)

(52) U.S. Cl.
CPC ....... *H10F 39/8037* (2025.01); *H10F 39/802* (2025.01); *H10F 39/811* (2025.01)

(58) Field of Classification Search
CPC .......... H10F 39/00; H10F 39/12; H10F 39/18; H10F 39/802; H10F 39/8037; H10F 39/8023; H10F 39/804; H10F 39/8053; H10F 39/807; H10F 39/809; H10F 39/811; H10F 39/813
See application file for complete search history.

(56) References Cited

U.S. PATENT DOCUMENTS

| | | | |
|---|---|---|---|
| 2020/0312901 A1 | 10/2020 | Xu et al. |
| 2020/0366856 A1 | 11/2020 | Kato et al. |
| 2021/0195125 A1 | 6/2021 | Takahashi et al. |
| 2022/0068987 A1 | 3/2022 | Park |
| 2022/0077220 A1 | 3/2022 | Tanaka et al. |

(Continued)

FOREIGN PATENT DOCUMENTS

| | | |
|---|---|---|
| KR | 10-2009-0110729 A | 10/2009 |
| KR | 10-2022-0166626 A | 12/2022 |

OTHER PUBLICATIONS

Office Action in Korean Appln. No. 10-2023-0005527, mailed on Jul. 27, 2026, 15 pages (with English translation).

*Primary Examiner* — Brook Kebede
(74) *Attorney, Agent, or Firm* — Fish & Richardson P.C.

(57) ABSTRACT

An image sensor, including a shared pixel including two sub pixels of a 1×2 structure and sharing a floating diffusion region on each of the two sub pixels through a metal wiring, unit pixels surrounding the floating diffusion region, within the shared pixel, separated from each other by front-side deep trench isolation, and each including a photodiode, a transfer transistor adjacent to the floating diffusion region and on each of the unit pixels, a reset transistor and a selection transistor on a first unit pixel located in a first quadrant among the unit pixels, a conversion gain transistor on a second unit pixel located in a second quadrant among the unit pixels, and a source follower transistor on a third unit pixel located in a third quadrant and a fourth unit pixel located in a fourth quadrant among the unit pixels.

20 Claims, 17 Drawing Sheets

(56) References Cited

U.S. PATENT DOCUMENTS

| | | | | |
|---|---|---|---|---|
| 2022/0109012 | A1 | 4/2022 | Moon et al. | |
| 2022/0360731 | A1* | 11/2022 | Kim | H04N 25/771 |
| 2022/0399384 | A1* | 12/2022 | Cho | H10F 39/811 |
| 2023/0094071 | A1* | 3/2023 | Park | H10F 39/8037 257/292 |
| 2023/0207583 | A1* | 6/2023 | Kim | H10F 39/8023 257/292 |

* cited by examiner

IMAGE SENSOR HAVING A REDUCED LENGTH METAL WIRING CONNECTING FLOATING DIFFUSION REGIONS

CROSS-REFERENCE TO RELATED APPLICATION

Korean Patent Application No. 10-2023-0005527, filed on Jan. 13, 2023, in the Korean Intellectual Property Office, is incorporated by reference herein in its entirety.

BACKGROUND

1. Field

An image sensor having a reduced length metal wiring connecting floating diffusion regions is disclosed.

2. Description of the Related Art

An image sensor is a device that converts an optical image signal into an electrical signal. The image sensor includes a plurality of pixels, and each pixel includes a photodiode that receives incident light and converts the incident light into an electrical signal, and a pixel circuit that outputs a pixel signal by using charges generated by the photodiode. As the degree of integration of the image sensor increases, the size of each pixel decreases.

SUMMARY

Embodiments are directed to an image sensor, including a shared pixel including two sub pixels of a 1×2 structure and sharing a floating diffusion region on each of the two sub pixels through a metal wiring, unit pixels surrounding the floating diffusion region, within the shared pixel, separated from each other by front-side deep trench isolation, and each including a photodiode, a transfer transistor adjacent to the floating diffusion region and on each of the unit pixels, a reset transistor and a selection transistor on a first unit pixel located in a first quadrant among the unit pixels, a conversion gain transistor on a second unit pixel located in a second quadrant among the unit pixels, and a source follower transistor on a third unit pixel located in a third quadrant and a fourth unit pixel located in a fourth quadrant among the unit pixels, wherein the metal wiring connects the floating diffusion regions to a source region of the conversion gain transistor and a gate of the source follower transistor, and an acute angle formed by the floating diffusion regions contacting the metal wiring.

Embodiments are directed to an image sensor, including a shared pixel including two sub pixels of a 1×2 structure, each of the two sub pixels sharing, through a metal wiring, a floating diffusion region thereon, unit pixels surrounding the floating diffusion region, within the shared pixel, separated from each other by front-side deep trench isolation, and each including a photodiode, a transfer transistor adjacent to the floating diffusion region and on each of the unit pixels, a first source follower transistor on a first unit pixel located in a first quadrant among the unit pixels, a conversion gain transistor on a second unit pixel located in a second quadrant among the unit pixels, a reset transistor and a selection transistor on a third unit pixel located in a third quadrant among the unit pixels, and a second source follower transistor on a fourth unit pixel located in a fourth quadrant among the unit pixels, wherein the metal wiring connects the floating diffusion regions to a source region of the conversion gain transistor and a gate of the first source follower transistor, and a right angle formed by the floating diffusion regions contacting the metal wiring.

Embodiments are directed to an image sensor, including a shared pixel including four sub pixels of a 2×2 structure, each of the four sub pixels sharing, through a metal wiring, a floating diffusion region thereon, unit pixels surrounding the floating diffusion region, within the shared pixel, separated from each other by front-side deep trench isolation, and each including a photodiode, wherein four unit pixels are in a first row and four unit pixels are in a second row, a transfer transistor adjacent to the floating diffusion region and on each of the unit pixels, a conversion gain transistor on one unit pixel of the first row among the unit pixels, and a source follower transistor on two unit pixels of the second row among the unit pixels, wherein the metal wiring connects the floating diffusion regions to a source region of the conversion gain transistor and a gate of the source follower transistor, and an acute angle formed by the floating diffusion regions contacting the metal wiring.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
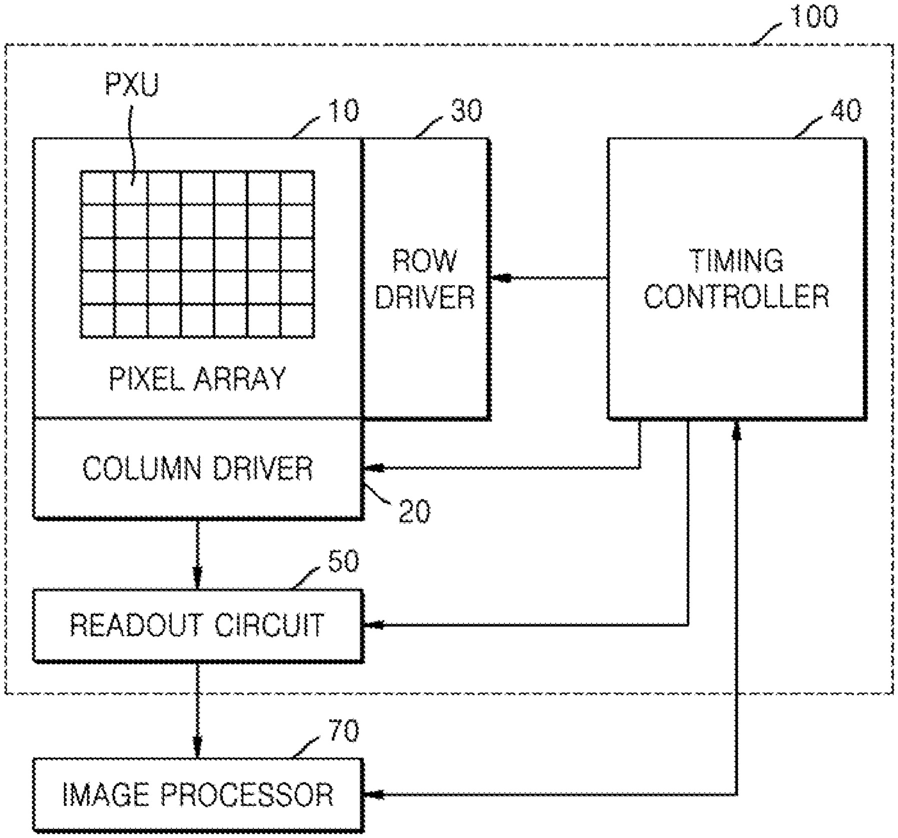
FIG. 1 is a block diagram showing an image sensor connected to an image processor according to an example embodiment.

FIG. 1 is a block diagram showing an image sensor connected to an image processor according to an example embodiment. Referring to FIG. 1, an image sensor 100 according to an embodiment may include a pixel array 10 and circuits configured to control the pixel array 10.

In some embodiments, the circuits configured to control the pixel array 10 may include a column driver 20, a row driver 30, a timing controller 40, and a readout circuit 50. The image sensor 100 may operate in response to a control command received from an image processor 70, convert light transmitted from an external object into an electric signal, and output the electric signal to the image processor 70. The image sensor 100 may be a complementary metal-oxide-semiconductor (CMOS) image sensor.

The pixel array 10 may include a plurality of unit pixels PXU having a two-dimensional (2D) array structure arranged in a matrix form along a plurality of row lines and a plurality of column lines. A row herein means a set of a plurality of unit pixels arranged in a horizontal direction among a plurality of unit pixels included in the pixel array 10, and a column herein means a set of a plurality of unit pixels arranged in a vertical direction among the plurality of unit pixels included in the pixel array 10.

Each of the plurality of unit pixels PXU may have a multi-pixel structure including a plurality of photodiodes. The plurality of photodiodes of each of the plurality of unit pixels PXU may receive light transmitted from the object and generate charges. The image sensor 100 may perform an autofocus function by using a phase difference between pixel signals generated from the plurality of photodiodes of each of the plurality of unit pixels PXU. Each of the plurality of unit pixels PXU may include a pixel circuit configured to generate pixel signals from the charges generated by the plurality of photodiodes.

The column driver 20 may include a correlated double sampler (CDS), or an analog-to-digital converter (ADC). The CDS may be connected, through column lines, to the unit pixel PXU included in a row selected by a row selection signal supplied by the row driver 30 and perform correlated double sampling to detect a reset voltage and a pixel voltage. The ADC may convert the reset voltage and the pixel voltage detected by the CDS into digital signals and transmit the digital signals to the readout circuit 50. As used herein, the term "or" is not an exclusive term, e.g., "A or B" would include A, B, or A and B.

The readout circuit 50 may include a latch or buffer circuit and an amplification circuit capable of temporarily storing the digital signal, and temporarily store or amplify the digital signal received from the column driver 20 to generate image data. The operation timing of the column driver 20, the row driver 30, and the readout circuit 50 may be determined by the timing controller 40, and the timing controller 40 may operate based on a control command transmitted from the image processor 70.

The image processor 70 may signal-process image data output by the readout circuit 50 and output the signal-processed image data to a display device or store the signal-processed image data in a storage device, such as a memory. When the image sensor 100 is mounted on an autonomous vehicle, the image processor 70 may signal-process the image data and transmit the signal-processed image data to a main controller that controls the autonomous vehicle.

Figure 2:
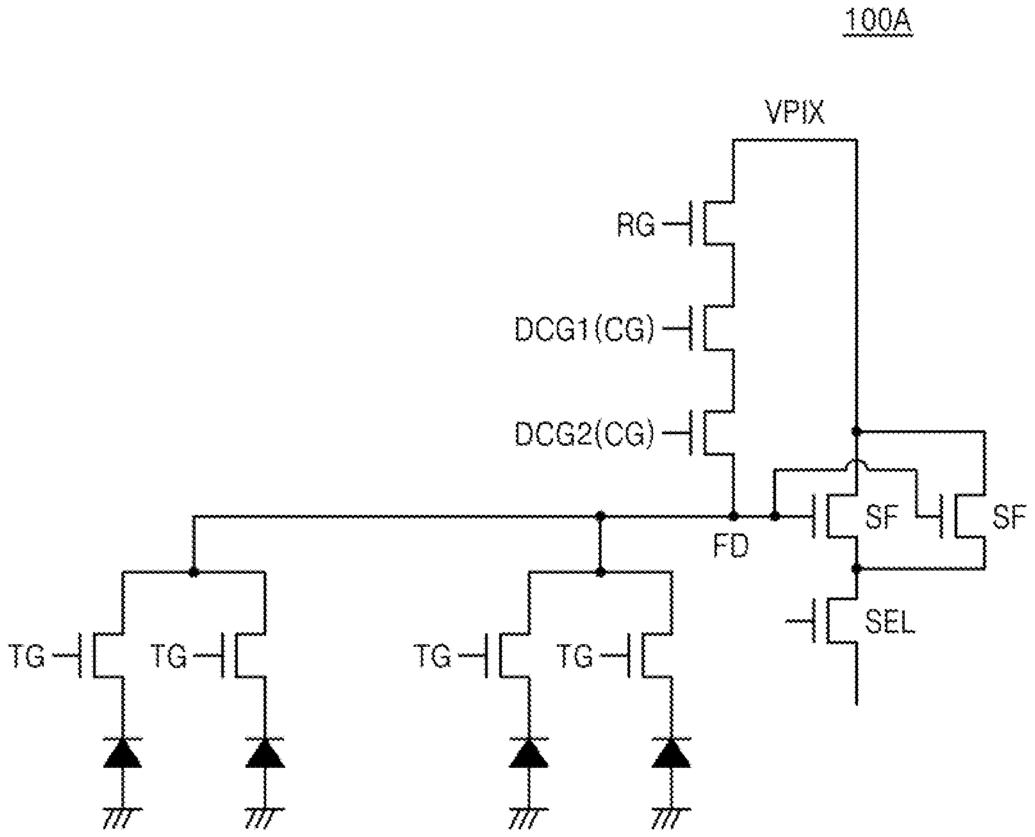
FIG. 2 is a circuit diagram showing a pixel unit included in an image sensor according to an example embodiment.
Figure 3:
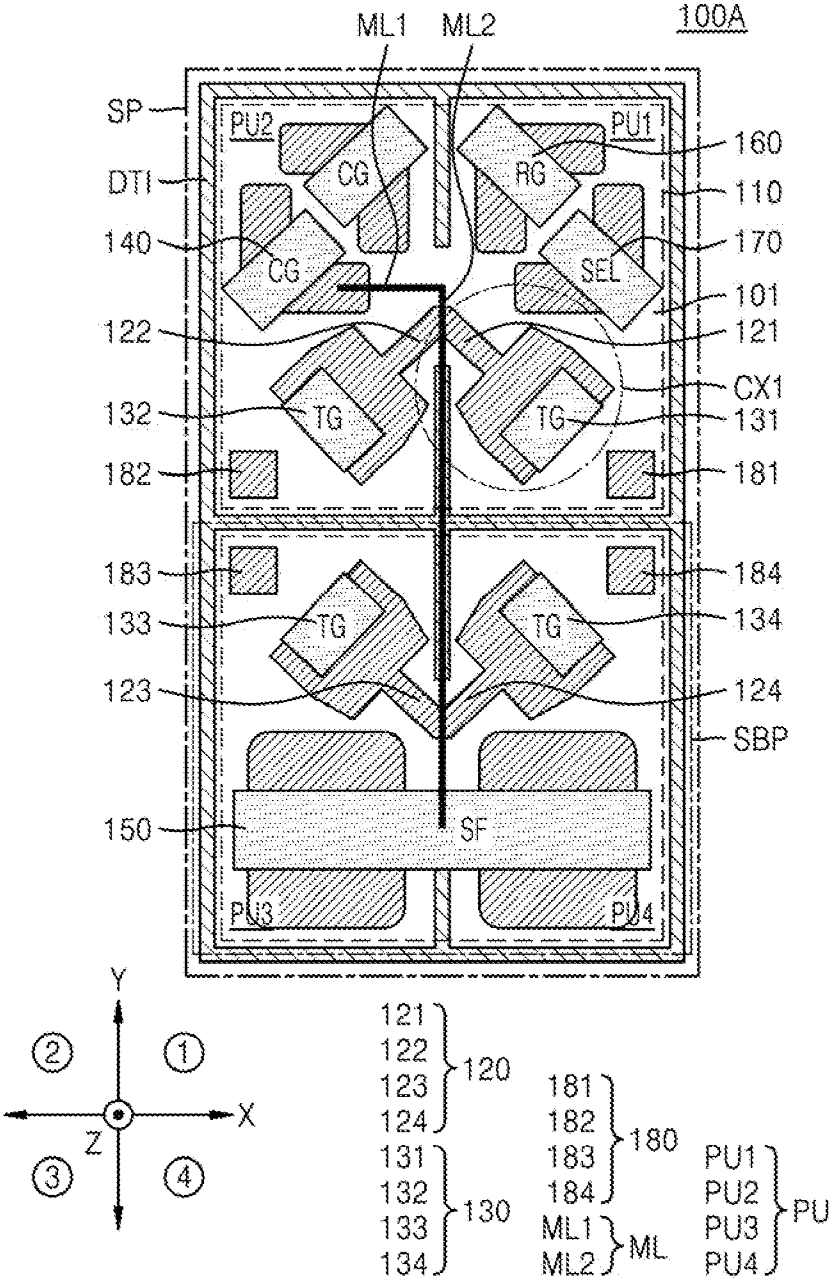
FIG. 3 is a plan layout showing shared pixels of the image sensor according to an example embodiment corresponding to the circuit diagram of FIG. 2.
Figure 4:
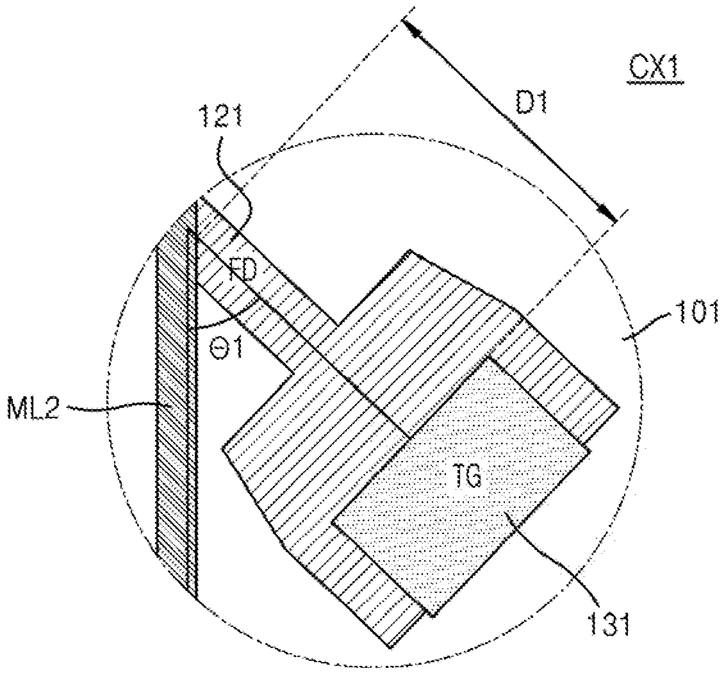
FIG. 4 is an enlarged view showing a portion CX1 of FIG. 3.

FIG. 2 is a circuit diagram showing a pixel unit included in an image sensor according to an example embodiment. FIG. 3 is a plan layout showing shared pixels of the image sensor according to an example embodiment corresponding to the circuit diagram of FIG. 2. FIG. 4 is an enlarged view showing a portion CX1 of FIG. 3.

Referring together with FIGS. 2 to 4, an image sensor 100A of the present embodiment may include a plurality of shared pixels SP on a substrate 101 in a two-dimensional (2D) array structure.

Each shared pixel SP may include a plurality of unit pixels PU. In some embodiments, the shared pixel SP may include a photodiode 110, a floating diffusion region 120, a transfer transistor 130, various types of pixel transistors 140, 150, 160, and 170, and a ground region 180.

Each unit pixel PU may be isolated from each other by deep trench isolation (DTI). In some embodiments, the DTI may be a front-side deep trench isolation. The front-side deep trench isolation may be inside the substrate 101 in a third direction (Z direction) perpendicular to a front side of the substrate 101. In addition, the photodiode 110 may be inside each unit pixel PU.

The shared pixel SP may have a rectangular shape as a whole and may include a region corresponding to one color filter. In other words, one identical color filter may be on an upper portion of the photodiode 110 of all the unit pixels PU constituting the shared pixel SP. Accordingly, light of the same wavelength range may be incident to the photodiode 110 of the unit pixels PU of the shared pixel SP.

Meanwhile, the shared pixel SP may include a plurality of sub pixels SBP. Each sub pixel SBP may mean a pixel within a range covered by a micro lens. The sub pixel SBP may include one unit pixel PU or may include the plurality of unit pixels PU.

In the image sensor 100A of the present embodiment, each shared pixel SP may include two sub pixels SBP of a 1×2 structure. Also, each sub pixel SBP may include two unit pixels PU. In an implementation, one shared pixel SP may include four unit pixels PU.

The unit pixel PU may include the photodiode 110, the floating diffusion region 120, and the transfer transistor 130. Also, in a vertical form, the transfer transistor 130 and various types of pixel transistors 140, 150, 160, and 170 may be on a surface portion of the substrate 101, and the photodiode 110 may be below the surface of the substrate 101, e.g., below the transfer transistor 130 and the various types of pixel transistors 140, 150, 160, and 170. In some embodiments, the transfer transistor 130 may have a vertical gate structure and be connected to the photodiode 110.

Each floating diffusion region 120 may be on a central portion of each unit pixel PU. However, the floating diffusion regions 120 at different locations may be shared by all photodiodes 110 of the shared pixel SP through a metal wiring ML. In other words, charges generated by all the photodiodes 110 of the shared pixel SP may be stored in the floating diffusion region 120 and used as an image signal.

With regard to a planar shape of the floating diffusion region 120, each floating diffusion region 120 may have a shape surrounded by the DTI dividing the unit pixels PU from each other. In addition, the floating diffusion regions 120 may have a shape contacting each other in a silicon region of the substrate 101 where a part of the DTI dividing the two unit pixels PU within the sub pixel SBP is cut off, and extending to each unit pixel PU in an oblique direction.

Meanwhile, the shared pixel SP of the image sensor 100A of the present embodiment may be used while switching between a high pixel mode and a high sensitivity mode. Here, the high pixel mode may mean a mode in which photo-sensing signals of each unit pixel PU or each sub pixel SBP may be independently used, and the high sensitivity mode may mean a mode in which photo-sensing signals of the unit pixels PU constituting the shared pixel SP may be merged and used.

In other words, in the case of the high pixel mode, charges generated by the photodiode 110 of each unit pixel PU or each sub pixel SBP within the shared pixel SP may be used as each image signal through the floating diffusion region 120. In contrast, in the case of the high sensitivity mode, all charges generated by the photodiode 110 of the unit pixels PU within the shared pixel SP may be accumulated together in the floating diffusion region 120 and may be used as one image signal.

The transfer transistor 130 may be on each unit pixel PU within the shared pixel SP. In an implementation, because the shared pixel SP includes four unit pixels PU, four transfer transistors 130 may be on the shared pixel SP. The transfer transistor 130 may transfer charges generated by the corresponding photodiode 110 to the floating diffusion region 120. In the drawing, a transfer gate TG of the transfer transistor 130 is shown, and the transfer gate TG, the photodiode 110 corresponding thereto, and the floating diffusion region 120 corresponding thereto may constitute the transfer transistor 130.

The shared pixel SP may include the various types of pixel transistors 140, 150, 160, and 170 transferring signals corresponding to charges stored in the floating diffusion region 120. The various types of pixel transistors 140, 150, 160, and 170 may include, e.g., a conversion gain transistor 140, a source follower transistor 150, a reset transistor 160, and a selection transistor 170. In the drawing, a conversion gain gate CG of the conversion gain transistor 140 is shown, and a source follower gate SF of the source follower transistor 150 is shown. The conversion gain gate CG and the heavily doped regions on both sides thereof may constitute the conversion gain transistor 140, and the source follower gate SF and heavily doped regions on both sides thereof may constitute the source follower transistor 150.

Meanwhile, the conversion gain transistor 140 may be used to implement a dual conversion gain or a triple conversion gain of the shared pixel SP. Here, the conversion gain may mean a rate at which charges generated by the photodiode 110 may be transferred to the floating diffusion region 120 and accumulated, and the accumulated charges may be converted into a voltage.

In the shared pixel SP of the image sensor 100A of the present embodiment, the floating diffusion region 120 may be connected to a source region of the conversion gain transistor 140 and the source follower gate SF of the source follower transistor 150 through the metal wiring ML. This connection relationship may be understood through a circuit diagram. For reference, the metal wiring ML may be connected to a corresponding component through a vertical contact.

The arrangement relationship of components constituting the image sensor 100A of the present embodiment is described as follows. For convenience of understanding, the arrangement relationship is described using first to fourth quadrants based on a coordinate plane.

Here, a unit pixel PU located in the first quadrant among the unit pixels PU is referred to as a first unit pixel PU1, a unit pixel PU located in the second quadrant is referred to as a second unit pixel PU2, a unit pixel PU located in the third quadrant is referred to as a third unit pixel PU3, and a unit pixel PU located in the fourth quadrant is referred to as a fourth unit pixel PU4.

The reset transistor 160 and the selection transistor 170 may be on the first unit pixel PU1. In addition, a first floating diffusion region 121 and a first transfer transistor 131 may be on the first unit pixel PU1. In addition, a first ground region 181 may be on the first unit pixel PU1.

The conversion gain transistor 140 may be on the second unit pixel PU2. The conversion gain transistor 140 may include a first conversion gain gate DCG1 and a second conversion gain gate DCG2. In an implementation, only one conversion gain transistor 140 may exist. In addition, a second floating diffusion region 122 and a second transfer transistor 132 may be on the second unit pixel PU2. In addition, a second ground region 182 may be on the second unit pixel PU2.

A merged gate structure of the source follower transistor 150 may be over the third unit pixel PU3 and the fourth unit pixel PU4. In an implementation, a plane area occupied by the merged gate structure of the source follower transistor 150 may be larger than that of gate structures of other pixel transistors. The merged gate structure of the source follower transistor 150 may include conductive polysilicon, and thus, the length of the metal wiring ML connecting the source follower transistor 150 and the floating diffusion region 120 may be reduced.

In addition, a third floating diffusion region 123 and a third transfer transistor 133 may be on the third unit pixel PU3, and a fourth floating diffusion region 124 and a fourth transfer transistor 134 may be on the fourth unit pixel PU4. Also, a third ground region 183 may be on the third unit pixel PU3, and a fourth ground region 184 may be on the fourth unit pixel PU4.

As described above, the metal wiring ML may electrically connect the floating diffusion regions 120 to the source region of the conversion gain transistor 140 and the source follower gate SF of the source follower transistor 150.

In the image sensor 100A of the present embodiment, the floating diffusion regions 120 may be a first angle θ1 formed by the floating diffusion regions 120 contacting the metal wiring ML is an acute angle. In some embodiments, the metal wiring ML may include a first metal wiring ML1 formed in a straight line in a first direction (X direction) in the source region of the conversion gain transistor 140 and a second metal wiring ML2 formed in a straight line in a second direction (Y direction) in the source follower gate SF of the source follower transistor 150. Here, an angle formed by contacting an end of the first metal wiring ML1 with an end of the second metal wiring ML2 may be a right angle. In other words, the metal wiring ML may be arranged in an L shape.

Here, the floating diffusion regions 120 may contact the second metal wiring ML2 among the metal wiring ML. In an implementation, the floating diffusion regions 120 may not contact the first metal wiring ML1 among the metal wiring ML. An angle formed by the floating diffusion regions 120 contacting the second metal wiring ML2 may be about 45°. Accordingly, the transfer transistors 130 may be located in an oblique direction with respect to the second metal wiring ML2.

Also, the second metal wiring ML2 may be disposed along the boundary of the unit pixels PU. Accordingly, the second metal wiring ML2 may be connected to the center of the source follower gate SF of the source follower transistor 150. In addition, at least a part of the metal wiring ML may overlap the DTI in the third direction (Z direction). According to such an arrangement relationship, the length of the metal wiring ML may relatively decrease, and a first distance D1 between the floating diffusion regions 120 and the transfer transistors 130 may relatively increase. The effect in this regard is described below.

The image sensor 100A of the present embodiment may include a plurality of shared pixels SP in a 2D array structure. In an implementation, in the image sensor 100A of the present embodiment, the plurality of shared pixels SP may be in the first direction (X direction) and the second direction (Y direction).

In the image sensor 100A of the present embodiment, the plurality of floating diffusion regions 120 electrically connected by the metal wiring ML may be disposed, and connected to the source region of 140 and the source follower gate SF of the source follower transistor 150 through the metal wiring ML.

A general image sensor may have a structure in which a shared pixel includes two sub pixels, and floating diffusion regions may be on each sub pixel, and all connected through a metal wiring. In the case of the general image sensor, a conversion gain may decrease due to an increase in the length of the metal wiring corresponding to the floating diffusion regions. In addition, fixed pattern noise may increase due to a decrease in the distance between the floating diffusion region and the transfer gate.

To solve these problems, the image sensor 100A of the present embodiment may share the floating diffusion region 120 through the silicon region of the substrate 101. In an implementation, the first angle θ1 formed by the floating diffusion region 120 and the metal wiring ML is designed as an acute angle, and thus, the length of the metal wiring ML may be relatively reduced, thereby relatively increasing the conversion gain. Also, fixed pattern noise may be relatively reduced by designing the first distance D1 between the floating diffusion regions 120 and the transfer gate TG in an oblique direction.

Ultimately, the image sensor 100A may share the floating diffusion regions 120 through the silicon region of the substrate 10 and reduce the length of the metal wiring ML connecting the floating diffusion regions 120, thereby minimizing fixed pattern noise while maintaining a high conversion gain.

FIGS. 5 to 8 are planar layouts showing shared pixels of an image sensor according to example embodiments corresponding to the circuit diagram of FIG. 2. Most components constituting image sensors 100B, 100C, 100D, and 100E and materials constituting the components described below are substantially the same as or similar to those described above with reference to FIGS. 2 to 4. Therefore, for convenience of explanation, differences between the image sensors 100B, 100C, 100D, and 100E and the image sensor 100A described above are mainly described.

Figure 5:
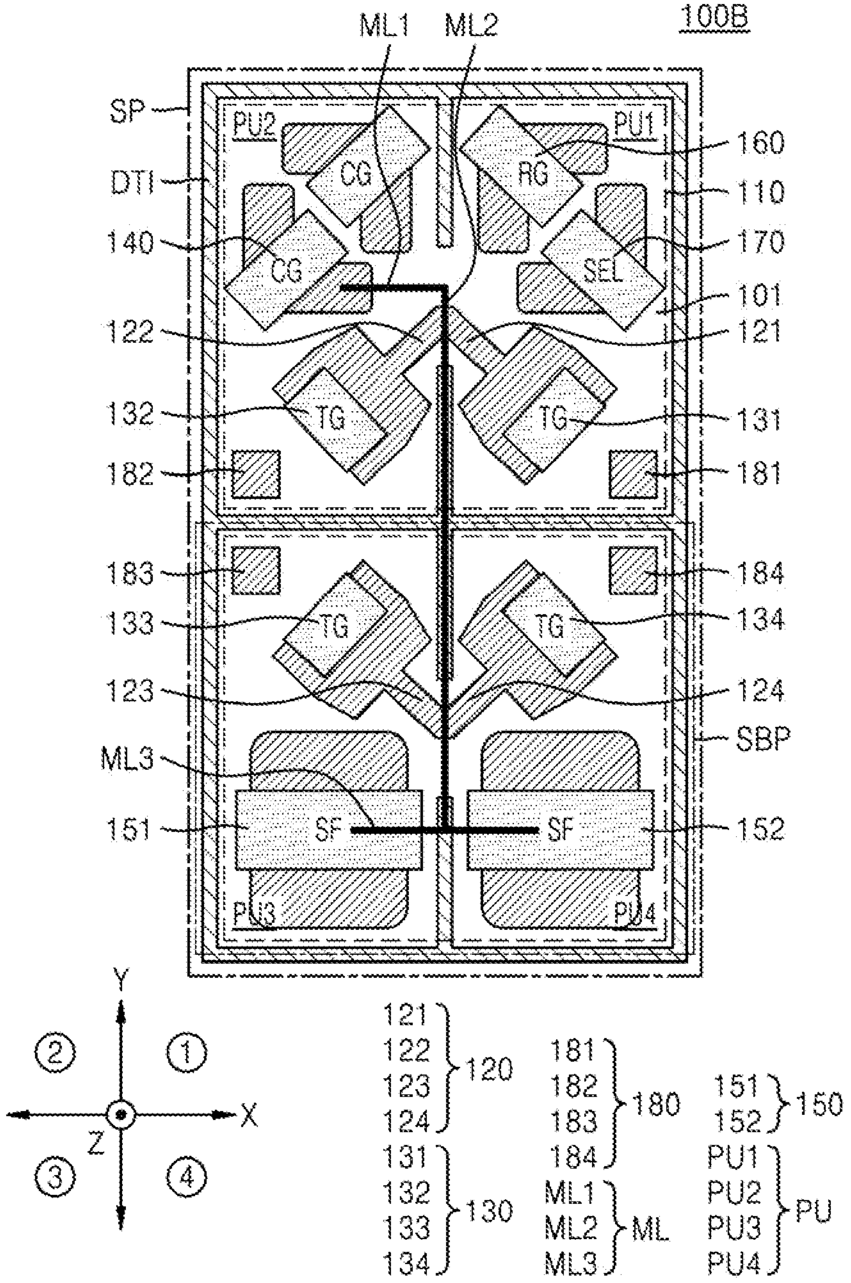
FIGS. 5 to 8 are planar layouts showing shared pixels of an image sensor according to example embodiments corresponding to the circuit diagram of FIG. 2.

Referring to FIG. 5, the image sensor 100B of the present embodiment may include the plurality of shared pixels SP on the substrate 101 in a 2D array structure.

Each shared pixel SP may include the plurality of unit pixels PU. In some embodiments, the shared pixel SP may include the photodiode 110, the floating diffusion region 120, the transfer transistor 130, the various types of pixel transistors 140, 150, 160, and 170, and the ground region 180.

The reset transistor 160 and the selection transistor 170 may be on the first unit pixel PU1. In addition, the first floating diffusion region 121 and the first transfer transistor 131 may be on the first unit pixel PU1. In addition, the first ground region 181 may be on the first unit pixel PU1.

The conversion gain transistor 140 may be on the second unit pixel PU2. The conversion gain transistor 140 may include the first conversion gain gate DCG1 and the second conversion gain gate DCG2. In an implementation, only one conversion gain transistor 140 may exist. In addition, the second floating diffusion region 122 and the second transfer transistor 132 may be on the second unit pixel PU2. In addition, the second ground region 182 may be on the second unit pixel PU2.

A first source follower transistor 151 may be on the third unit pixel PU3. In addition, the third floating diffusion region 123 and the third transfer transistor 133 may be on the third unit pixel PU3. In addition, the third ground region 183 may be on the third unit pixel PU3.

A second source follower transistor 152 may be on the fourth unit pixel PU4. In addition, the fourth floating diffusion region 124 and the fourth transfer transistor 134 may be on the fourth unit pixel PU4. In addition, the fourth ground region 184 may be on the fourth unit pixel PU4.

In an implementation, in the image sensor 100B of the present embodiment, the first and second source follower transistors 151 and 152 may be formed with gate structures separated from each other, and the separated gate structures may be electrically connected to each other through a third metal wiring ML3.

Figure 6:
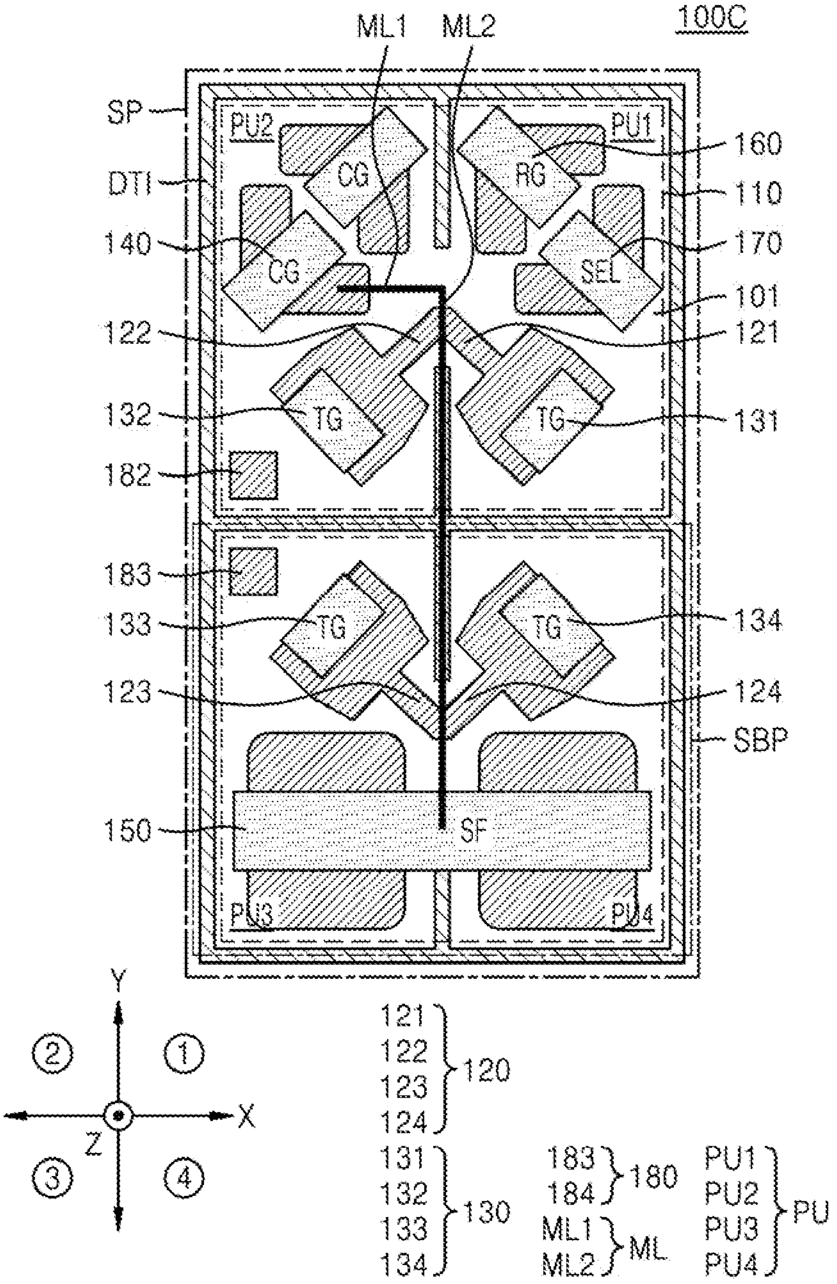

Referring to FIG. 6, the image sensor 100C of the present embodiment may include the plurality of shared pixels SP on the substrate 101 in a 2D array structure.

Each shared pixel SP may include the plurality of unit pixels PU. In some embodiments, the shared pixel SP may include the photodiode 110, the floating diffusion region 120, the transfer transistor 130, the various types of pixel transistors 140, 150, 160, and 170, and the ground region 180.

The reset transistor 160 and the selection transistor 170 may be on the first unit pixel PU1. In addition, the first floating diffusion region 121 and the first transfer transistor 131 may be on the first unit pixel PU1. In addition, the ground region 180 may not be on the first unit pixel PU1.

The conversion gain transistor 140 may be on the second unit pixel PU2. The conversion gain transistor 140 may include a first conversion gain gate DCG1 and a second conversion gain gate DCG2. In an implementation, only one conversion gain transistor 140 may exist. In addition, the second floating diffusion region 122 and the second transfer transistor 132 may be on the second unit pixel PU2. In addition, the second ground region 182 may be on the second unit pixel PU2.

The merged gate structure of the source follower transistor 150 may be over the third unit pixel PU3 and the fourth unit pixel PU4. In an implementation, a plane area occupied by the merged gate structure of the source follower transistor 150 may be larger than that of gate structures of other pixel transistors. The merged gate structure of the source follower transistor 150 may include conductive polysilicon, and thus, the length of the metal wiring ML connecting the source follower transistor 150 and the floating diffusion region 120 may be reduced.

Figure 7:
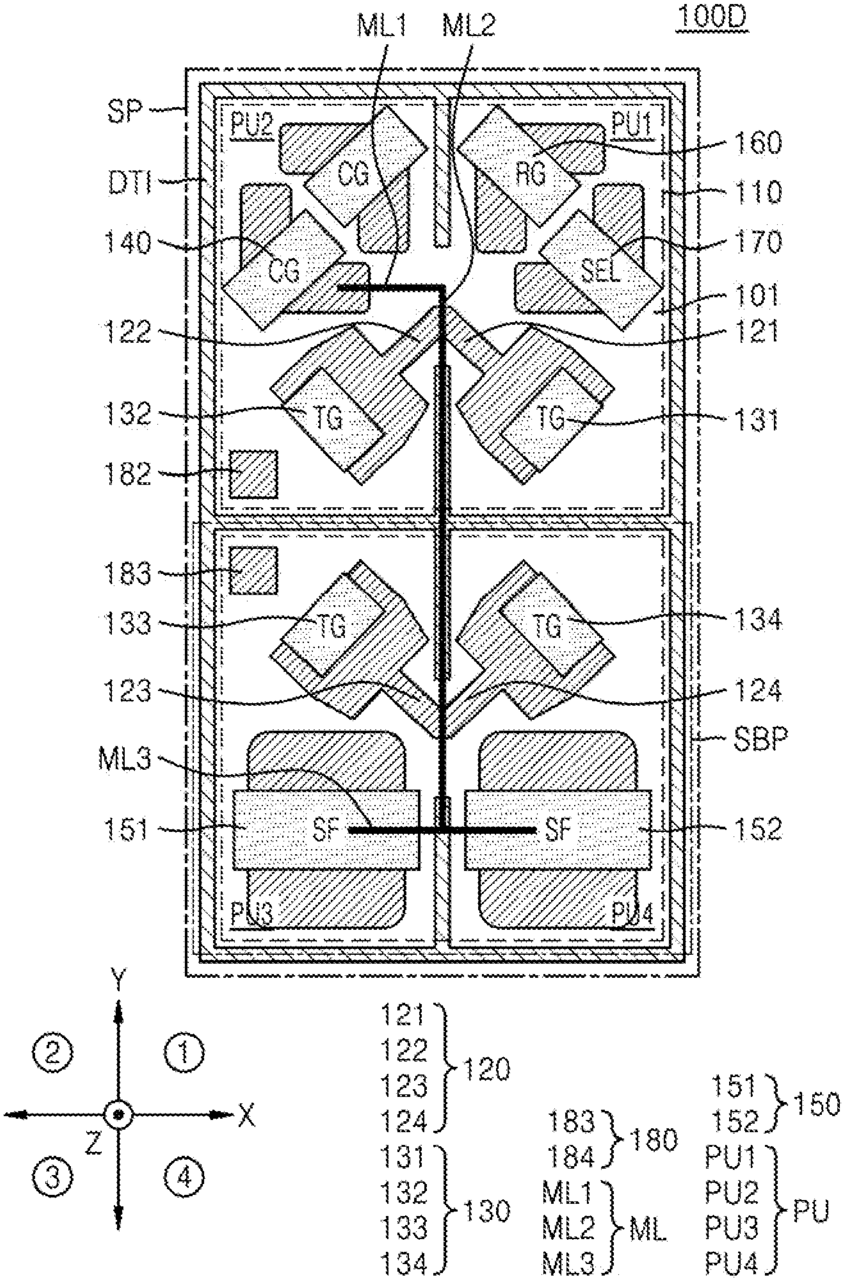

In addition, the third floating diffusion region 123 and the third transfer transistor 133 may be on the third unit pixel PU3, and the fourth floating diffusion region 124 and the fourth transfer transistor 134 may be on the fourth unit pixel PU4. Also, the third ground region 183 may be on the third unit pixel PU3, and the ground region 180 may not be on the fourth unit pixel PU4. In an implementation, in the image sensor 100C of the present embodiment, one ground region 180 may be on one sub pixel SBP. Referring to FIG. 7, the image sensor 100D of the present embodiment may include the plurality of shared pixels SP on the substrate 101 in a 2D array structure.

Each shared pixel SP may include the plurality of unit pixels PU. In some embodiments, the shared pixel SP may include the photodiode 110, the floating diffusion region 120, the transfer transistor 130, the various types of pixel transistors 140, 150, 160, and 170, and the ground region 180.

The reset transistor 160 and the selection transistor 170 may be on the first unit pixel PU1. In addition, the first floating diffusion region 121 and the first transfer transistor 131 may be on the first unit pixel PU1. Also, the ground region 180 may not be on the first unit pixel PU1.

The conversion gain transistor 140 may be on the second unit pixel PU2. The conversion gain transistor 140 may include the first conversion gain gate DCG1 and the second conversion gain gate DCG2. In an implementation, only one conversion gain transistor 140 may exist. In addition, the second floating diffusion region 122 and the second transfer transistor 132 may be on the second unit pixel PU2. In addition, the second ground region 182 may be on the second unit pixel PU2.

The first source follower transistor 151 may be on the third unit pixel PU3. In addition, the third floating diffusion region 123 and the third transfer transistor 133 may be on the third unit pixel PU3. In addition, the third ground region 183 may be on the third unit pixel PU3.

The second source follower transistor 152 may be on the fourth unit pixel PU4. In addition, the fourth floating diffusion region 124 and the fourth transfer transistor 134 may be on the fourth unit pixel PU4. Also, the ground region 180 may not be on the fourth unit pixel PU4.

In an implementation, in the image sensor 100D of the present embodiment, the first and second source follower transistors 151 and 152 may be formed with gate structures separated from each other, and the separated gate structures may be electrically connected to each other through the third metal wiring ML3.

Also, in the image sensor 100D of the present embodiment, one ground region 180 may be on one sub pixel SBP.

Figure 8:
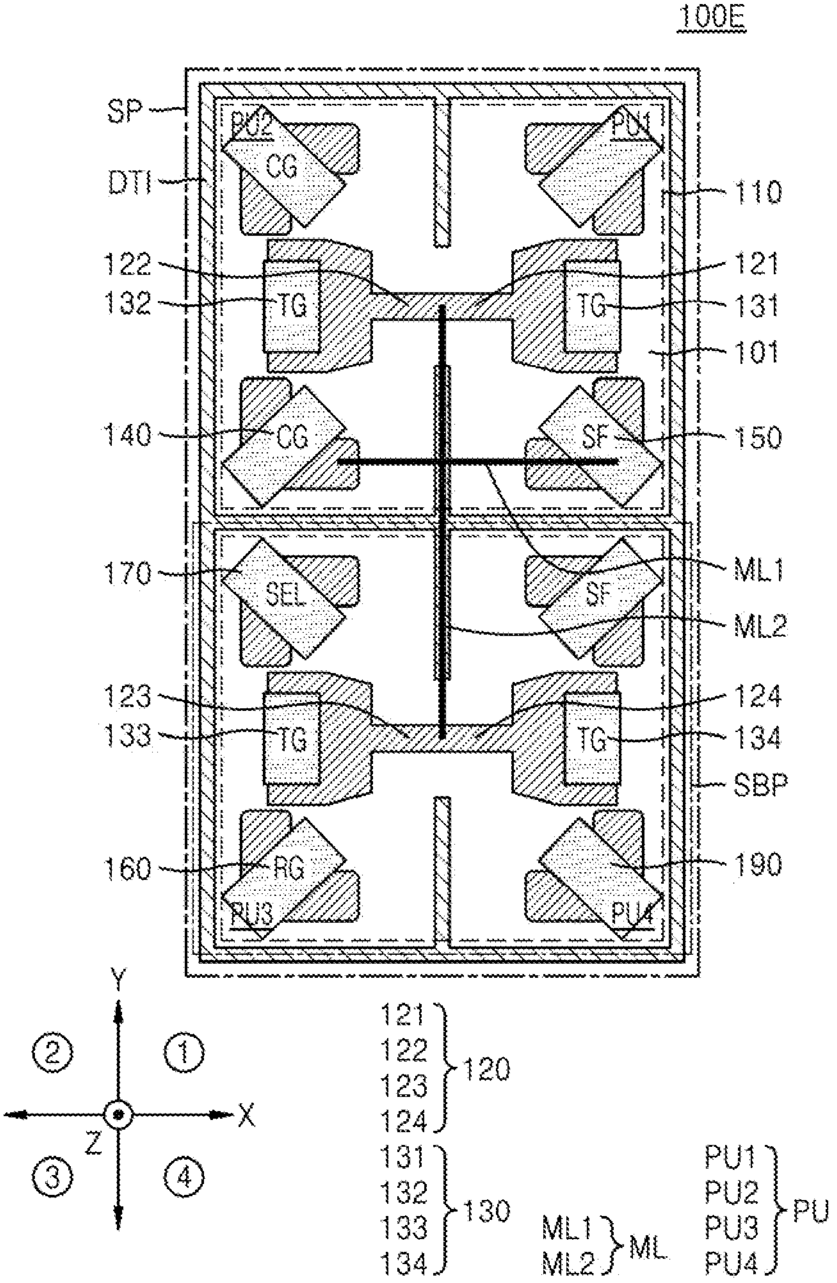

Referring to FIG. 8, the image sensor 100E of the present embodiment may include the plurality of shared pixels SP on the substrate 101 in a 2D array structure.

Each shared pixel SP may include the plurality of unit pixels PU. In some embodiments, the shared pixel SP may include the photodiode 110, the floating diffusion region 120, the transfer transistor 130, the various types of pixel transistors 140, 150, 160, and 170, and a dummy transistor 190.

The source follower transistor 150 may be on the first unit pixel PU1. In addition, the first floating diffusion region 121 and the first transfer transistor 131 may be on the first unit pixel PU1. Also, the first dummy transistor 190 may be on the first unit pixel PU1.

The conversion gain transistor 140 may be on the second unit pixel PU2. The conversion gain transistor 140 may include the first conversion gain gate DCG1 and the second conversion gain gate DCG2. In an implementation, only one conversion gain transistor 140 may exist. In addition, the second floating diffusion region 122 and the second transfer transistor 132 may be on the second unit pixel PU2.

The reset transistor 160 and the selection transistor 170 may be on the third unit pixel PU3. In addition, the third floating diffusion region 123 and the third transfer transistor 133 may be on the third unit pixel PU3.

The source follower transistor 150 may be on the fourth unit pixel PU4. In an implementation, the source follower transistor 150 may be on each of the first unit pixel PU1 and the fourth unit pixel PU4. In addition, the fourth floating diffusion region 124 and the fourth transfer transistor 134 may be on the fourth unit pixel PU4. In addition, a fourth dummy transistor 194 may be on the fourth unit pixel PU4.

In the image sensor 100E of the present embodiment, an angle formed by the floating diffusion regions 120 contacting the metal wiring ML may be a right angle. The metal wiring ML may include the first metal wiring ML1 formed in a straight line in the first direction (X direction) from the source region of the conversion gain transistor 140 to the source follower gate SF of the source follower transistor 150 and the second metal wiring ML2 formed in a straight line in the second direction (Y direction). The floating diffusion regions 120 may be connected to one end and the other end of the second metal wiring ML2. Also, the transfer transistors 130 may be located in parallel with respect to the second metal wiring ML2. At least a part of the metal wirings ML may overlap the DTI in the third direction (Z direction). In addition, the metal wiring ML may be in a cross shape, and a central point of the cross shape may coincide with a central point of the shared pixel SP.

Figure 9:
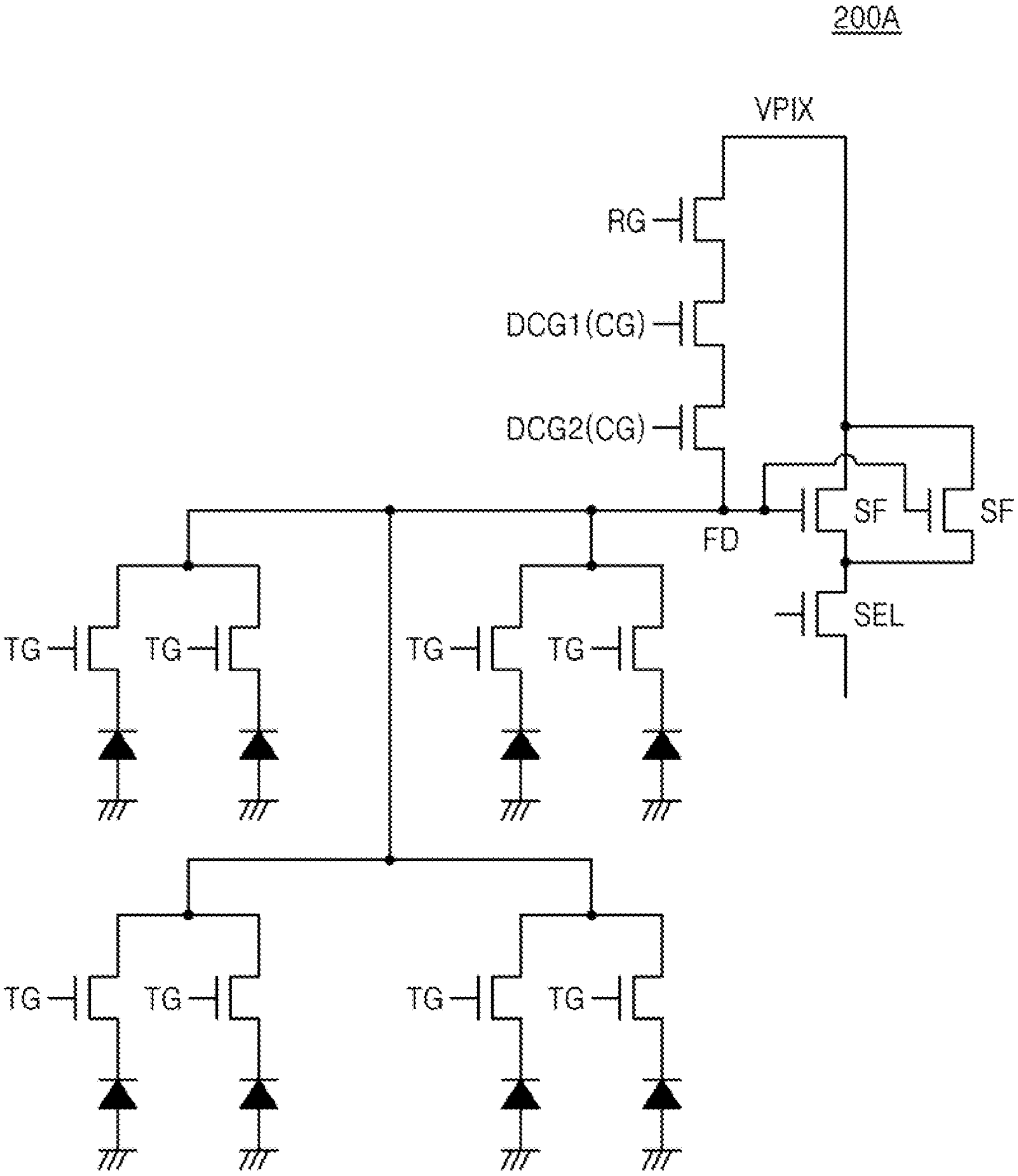
FIG. 9 is a circuit diagram showing a pixel unit included in an image sensor according to an example embodiment.
Figure 10:
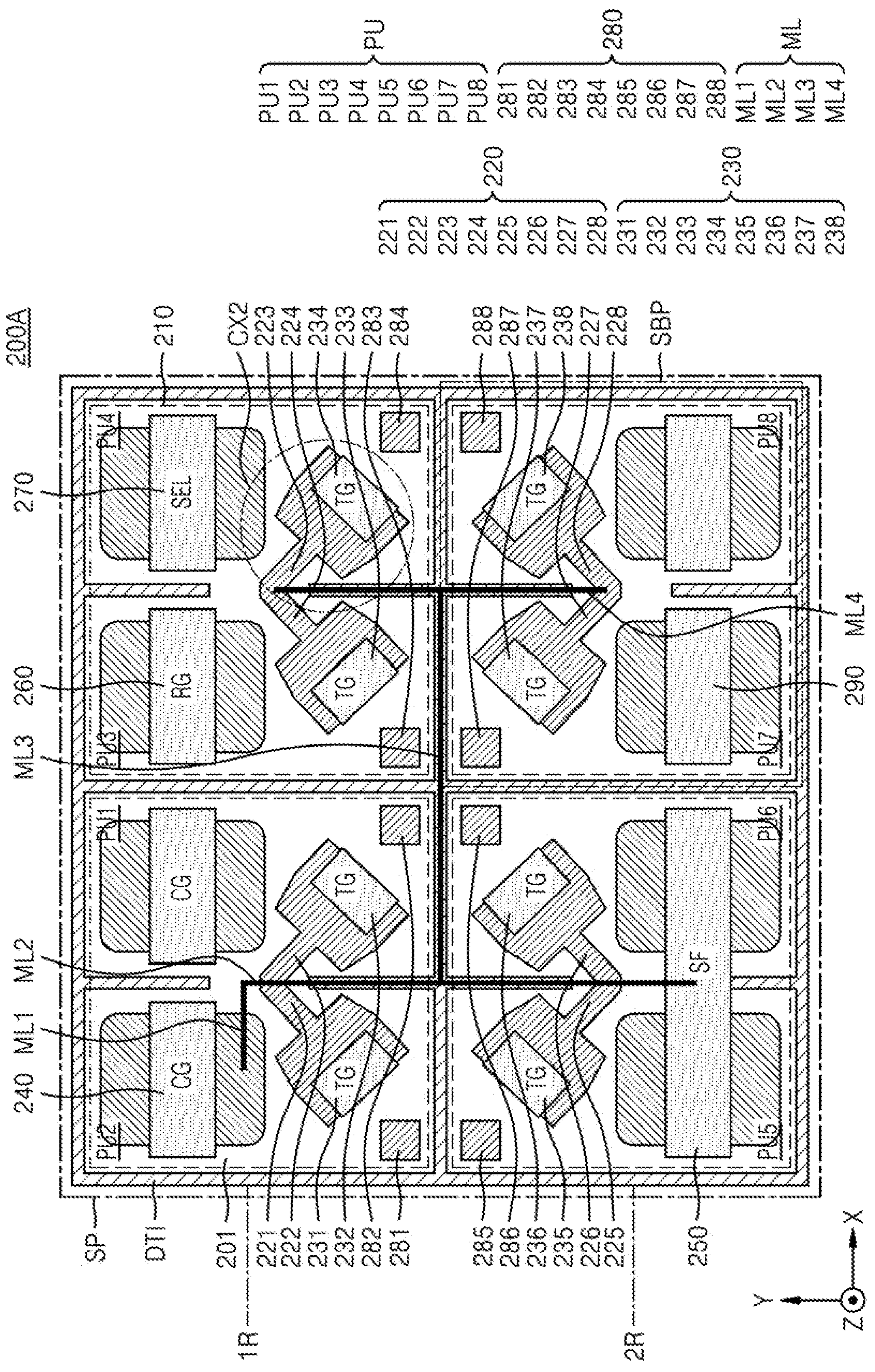
FIG. 10 is a plan layout showing shared pixels of the image sensor according to an example embodiment corresponding to the circuit diagram of FIG. 9.
Figure 11:
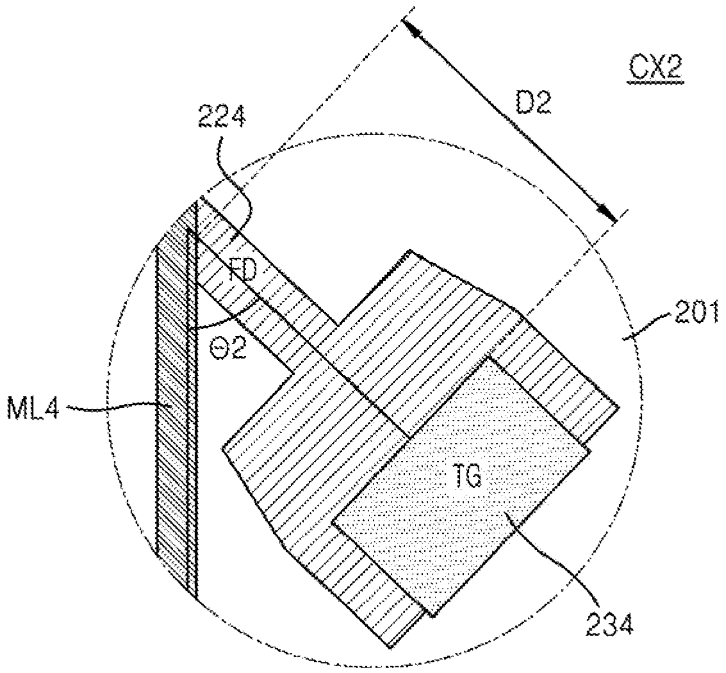
FIG. 11 is an enlarged view showing a portion CX2 of FIG. 10.

FIG. 9 is a circuit diagram showing a pixel unit included in an image sensor according to an example embodiment. FIG. 10 is a plan layout showing shared pixels of the image sensor according to an example embodiment corresponding to the circuit diagram of FIG. 9. FIG. 11 is an enlarged view showing a portion CX2 of FIG. 10.

Referring to FIGS. 9 to 11 together, an image sensor 200A of the present embodiment may include the plurality of shared pixels SP on a substrate 201 in a 2D array structure.

Each shared pixel SP may include the plurality of unit pixels PU. In some embodiments, the shared pixel SP may include a photodiode 210, a floating diffusion region 220, a transfer transistor 230, various types of pixel transistors 240, 250, 260, and 270, a ground region 280, and a dummy transistor 290.

In the image sensor 200A of the present embodiment, each shared pixel SP may include four sub pixels SBP of a 2×2 structure. Also, each sub pixel SBP may include two unit pixels PU. However, the number of sub pixels SBP included in the shared pixel SP and the number of unit pixels PU included in the sub pixel SBP.

The arrangement relationship of components constituting the image sensor 200A of the present embodiment is described as follows. For convenience of understanding, an upper side is referred to as a first row 1R in the drawing, and a lower side is referred to as a second row 2R in the drawing.

Here, the unit pixels PU in the first row 1R may be sequentially referred to as the first to fourth unit pixels PU1, PU2, PU3, and PU4, and the unit pixels PU in the second row 2R may be sequentially referred to as fifth to eighth unit pixels PU5, PU6, PU7, and PU8.

The conversion gain transistor 240 may be on each of the first and second unit pixels PU1 and PU2. The conversion gain transistor 240 may include the first conversion gain gate DCG1 and the second conversion gain gate DCG2. In an implementation, only one conversion gain transistor 240 may exist. Also, the first and second floating diffusion regions 221 and 222 and the first and second transfer transistors 231 and 232 may be on the first and second unit pixels PU1 and PU2. In addition, the first and second ground regions 281 and 282 may be on the first and second unit pixels PU1 and PU2.

The reset transistor 260 and the selection transistor 270 may be respectively on the third and fourth unit pixels PU3 and PU4. Also, third and fourth floating diffusion regions 223 and 224 and third and fourth transfer transistors 233 and 234 may be on the third and fourth unit pixels PU3 and PU4. Also, third and fourth ground regions 283 and 284 may be respectively on the third and fourth unit pixels PU3 and PU4.

A merged gate structure of the source follower transistor 250 may be over the fifth and sixth unit pixels PU5 and PU6. In an implementation, a plane area occupied by the merged gate structure of the source follower transistor 250 may be larger than that of gate structures of other pixel transistors. The merged gate structure of the source follower transistor 250 may include conductive polysilicon, and thus, the length of the metal wiring ML connecting the source follower transistor 250 and the floating diffusion region 220 may be reduced.

In addition, fifth and sixth floating diffusion regions 225 and 226 and fifth and sixth transfer transistors 235 and 236 may be on the fifth and sixth unit pixels PU5 and PU6. In addition, fifth and sixth ground regions 285 and 286 may be respectively on the fifth and sixth unit pixels PU5 and PU6.

The dummy transistor 290 may be on each of the seventh and eighth unit pixels PU7 and PU8. In addition, seventh and eighth floating diffusion regions 227 and 228 and seventh and eighth transfer transistors 237 and 238 may be on the seventh and eighth unit pixels PU7 and PU8. In addition, seventh and eighth ground regions 287 and 288 may be on the seventh and eighth unit pixels PU7 and PU8.

The metal wiring ML may electrically connect the floating diffusion regions 220 to a source region of the conversion gain transistor 240 and the source follower gate SF of the source follower transistor 250.

In the image sensor 200A of the present embodiment, the floating diffusion regions 220 may be disposed so that a second angle θ2 formed by the floating diffusion regions 220 contacting the metal wiring ML is an acute angle. In some embodiments, the metal wiring ML may include the first metal wiring ML1 formed in a straight line in the first direction (X direction) in the source region of the conversion gain transistor 240, the second metal wiring ML2 formed in a straight line in the second direction (Y direction) in the source follower gate SF of the source follower transistor 250, the third metal wiring ML3 formed in a straight line in the first direction (X direction) near the center of the second metal wiring ML2, and the fourth metal wiring ML4 formed in a straight line in the second direction (Y direction) in an end of the third metal wiring ML3. Here, the first to fourth metal wirings ML1, ML2, ML3, and ML4 may be electrically connected to each other.

Here, the floating diffusion regions 220 may contact the second and fourth metal wirings ML2 and ML4 among the metal wirings ML. In an implementation, the floating diffusion regions 220 may not contact the first and third metal wirings ML1 and ML3 among the metal wiring ML. An angle formed by the floating diffusion regions 220 contacting the second and fourth metal wirings ML2 and ML4 may be about 45°. Accordingly, the transfer transistors 230 may be located in an oblique direction with respect to the second and fourth metal wirings ML2 and ML4.

According to such an arrangement relationship, the length of the metal wiring ML may relatively decrease, and a first distance D2 between the floating diffusion regions 220 and the transfer transistors 230 may relatively increase. The effect in this regard is described above.

The image sensor 200A of the present embodiment may include a plurality of shared pixels SP in a 2D array structure. In an implementation, in the image sensor 200A of the present embodiment, the plurality of shared pixels SP may be disposed in the first direction (X direction) and the second direction (Y direction).

Ultimately, the image sensor 200A may share the floating diffusion regions 220 through the silicon region of the substrate 201 and reduce the length of the metal wiring ML connecting the floating diffusion regions 220, thereby minimizing fixed pattern noise while maintaining a high conversion gain.

Figure 12:
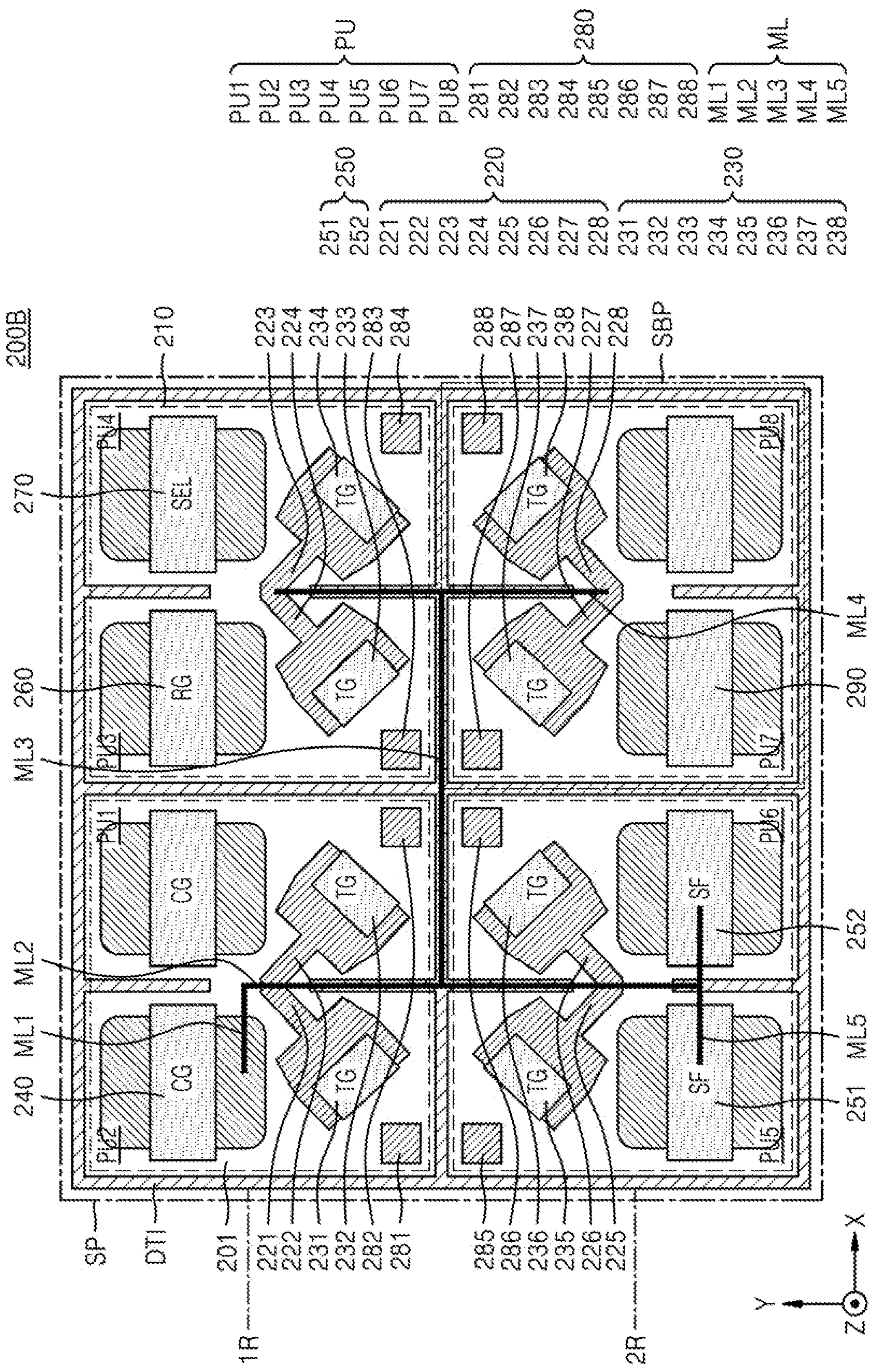
FIGS. 12 to 14 are planar layouts showing shared pixels of the image sensor according to example embodiments corresponding to the circuit diagram of FIG. 9.
Figure 13:
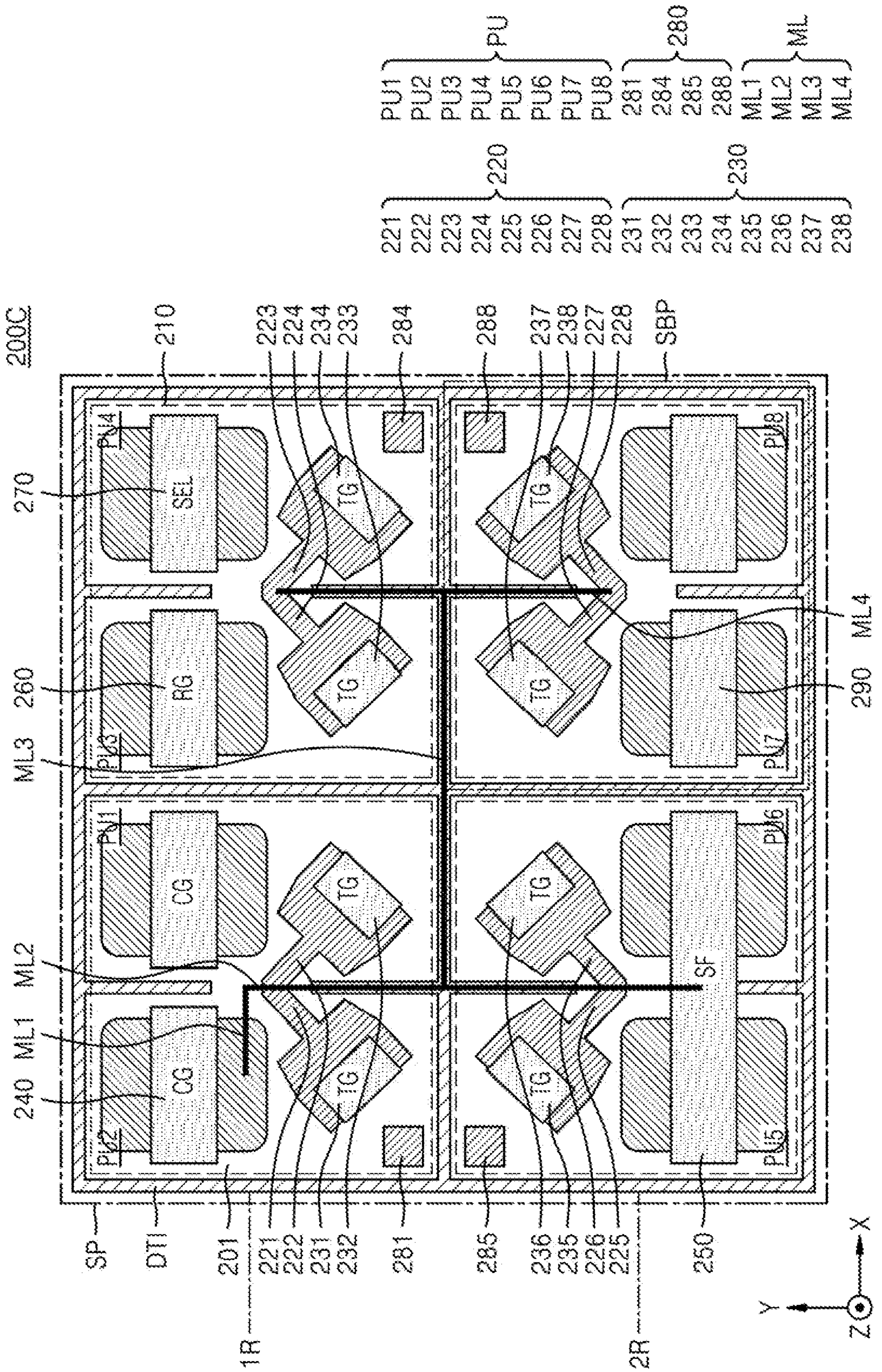
Figure 14:
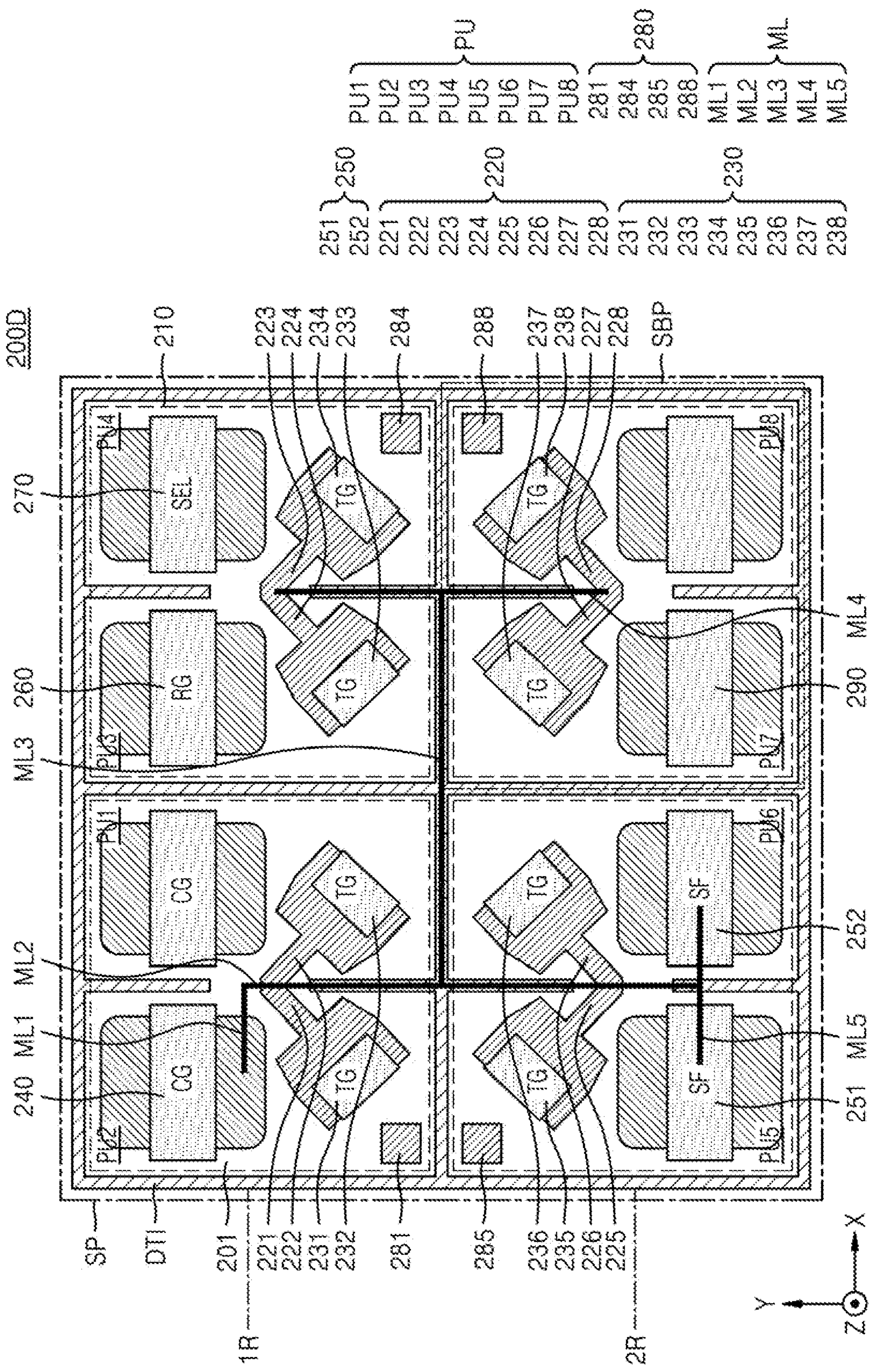

FIGS. 12 to 14 are planar layouts showing shared pixels of the image sensor according to example embodiments corresponding to the circuit diagram of FIG. 9. Most components constituting image sensors 200B, 200C, and 200D and materials constituting the components described below are substantially the same as or similar to those described above with reference to FIGS. 9 to 11. Therefore, for convenience of description, differences between the image sensors 200B, 200C, and 200D and the image sensor 200A described above are mainly described.

Referring to FIG. 12, the image sensor 200B of the present embodiment may include the plurality of shared pixels SP disposed on the substrate 201 in a 2D array structure.

Each shared pixel SP may include the plurality of unit pixels PU. In some embodiments, the shared pixel SP may include the photodiode 210, the floating diffusion region 220, the transfer transistor 230, the various types of pixel transistors 240, 250, 260, and 270, the ground region 280, and the dummy transistor 290.

The conversion gain transistor 240 may be on each of the first and second unit pixels PU1 and PU2. The conversion gain transistor 240 may include a first conversion gain transistor and a second conversion gain transistor. In an implementation, only one conversion gain transistor 240 may exist. Also, first and second floating diffusion regions 221 and 222 and first and second transfer transistors 231 and 232 may be on the first and second unit pixels PU1 and PU2. Also, the first ground region 281 may be on the first unit pixel PU1, and the second ground region 282 may be on the second unit pixel PU2.

The reset transistor 260 and the selection transistor 270 may be respectively on the third and fourth unit pixels PU3 and PU4. Also, the third and fourth floating diffusion regions 223 and 224 and the third and fourth transfer transistors 233 and 234 may be on the third and fourth unit pixels PU3 and PU4. Also, the third ground region 283 may be on the third unit pixel PU3 and the fourth ground region 284 may be on the fourth unit pixel PU4.

First and second source follower transistors 251 and 252 may respectively correspond to the fifth and sixth unit pixels PU5 and PU6. In an implementation, the first and second source follower transistors 251 and 252 may be formed with gate structures separated from each other, and the separated gate structures may be electrically connected to each other through a fifth metal wiring ML5. In addition, the fifth and sixth floating diffusion regions 225 and 226 and the fifth and sixth transfer transistors 235 and 236 may be on the fifth and sixth unit pixels PU5 and PU6. In addition, the fifth ground region 285 may be on the fifth unit pixel PU5, and the sixth ground region 286 may be on the sixth unit pixel PU6.

The dummy transistor 290 may be on each of the seventh and eighth unit pixels PU7 and PU8. In addition, the seventh and eighth floating diffusion regions 227 and 228 and the seventh and eighth transfer transistors 237 and 238 may be on the seventh and eighth unit pixels PU7 and PU8. Also, the seventh ground region 287 may be on the seventh unit pixel PU7, and the eighth ground region 288 may be on the eighth unit pixel PU8.

Referring to FIG. 13, the image sensor 200C of the present embodiment may include the plurality of shared pixels SP on the substrate 201 in a 2D array structure.

Each shared pixel SP may include the plurality of unit pixels PU. In some embodiments, the shared pixel SP may include the photodiode 210, the floating diffusion region 220, the transfer transistor 230, the various types of pixel transistors 240, 250, 260, and 270, the ground region 280, and the dummy transistor 290.

The conversion gain transistor 240 may be on each of the first and second unit pixels PU1 and PU2. The conversion gain transistor 240 may include a first conversion gain transistor and a second conversion gain transistor. In an implementation, only one conversion gain transistor 240 may exist. Also, the first and second floating diffusion regions 221 and 222 and the first and second transfer transistors 231 and 232 may be on the first and second unit pixels PU1 and PU2. In addition, the first ground region 281 may be only in the first unit pixel PU1.

The reset transistor 260 and the selection transistor 270 may be respectively on the third and fourth unit pixels PU3 and PU4. Also, the third and fourth floating diffusion regions 223 and 224 and the third and fourth transfer transistors 233 and 234 may be on the third and fourth unit pixels PU3 and PU4. In addition, the fourth ground region 284 may be only in the fourth unit pixel PU4.

A merged gate structure of the source follower transistor 250 may be over the fifth and sixth unit pixels PU5 and PU6. In an implementation, a plane area occupied by the merged gate structure of the source follower transistor 250 may be larger than that of gate structures of other pixel transistors. The merged gate structure of the source follower transistor 250 may include conductive polysilicon, and thus, the length of the metal wiring ML connecting the source follower transistor 250 and the floating diffusion region 220 may be reduced In addition, the fifth and sixth floating diffusion regions 225 and 226 and the fifth and sixth transfer transistors 235 and 236 may be on the fifth and sixth unit pixels PU5 and PU6. In addition, the fifth ground region 285 may be only in the fifth unit pixel PU5.

The dummy transistor 290 may be on each of the seventh and eighth unit pixels PU7 and PU8. In addition, the seventh and eighth floating diffusion regions 227 and 228 and the seventh and eighth transfer transistors 237 and 238 may be on the seventh and eighth unit pixels PU7 and PU8. In addition, the eighth ground region 288 may be only in the eighth unit pixel PU8.

In an implementation, in the image sensor 200C of the present embodiment, one ground region 280 may be on one sub pixel SBP.

Referring to FIG. 14, the image sensor 200D of the present embodiment may include the plurality of shared pixels SP on the substrate 201 in a 2D array structure.

Each shared pixel SP may include the plurality of unit pixels PU. In some embodiments, the shared pixel SP may include the photodiode 210, the floating diffusion region 220, the transfer transistor 230, the various types of pixel transistors 240, 250, 260, and 270, the ground region 280, and the dummy transistor 290.

The conversion gain transistor 240 may be on each of the first and second unit pixels PU1 and PU2. The conversion gain transistor 240 may include a first conversion gain transistor and a second conversion gain transistor. In an implementation, only one conversion gain transistor 240 may exist. Also, the first and second floating diffusion regions 221 and 222 and the first and second transfer transistors 231 and 232 may be on the first and second unit pixels PU1 and PU2. In addition, the first ground region 281 may be only in the first unit pixel PU1.

The reset transistor 260 and the selection transistor 270 may be respectively on the third and fourth unit pixels PU3 and PU4. Also, the third and fourth floating diffusion regions 223 and 224 and the third and fourth transfer transistors 233 and 234 may be on the third and fourth unit pixels PU3 and PU4. In addition, the fourth ground region 284 may be only in the fourth unit pixel PU4.

The first and second source follower transistors 251 and 252 may respectively correspond to the fifth and sixth unit pixels PU5 and PU6. In an implementation, the first and second source follower transistors 251 and 252 may be formed with gate structures separated from each other, and the separated gate structures may be electrically connected to each other through the fifth metal wiring ML5. In addition, the fifth and sixth floating diffusion regions 225 and 226 and the fifth and sixth transfer transistors 235 and 236 may be on the fifth and sixth unit pixels PU5 and PU6. In addition, the fifth ground region 285 may be only in the fifth unit pixel PU5.

The dummy transistor 290 may be on each of the seventh and eighth unit pixels PU7 and PU8. In addition, the seventh and eighth floating diffusion regions 227 and 228 and the seventh and eighth transfer transistors 237 and 238 may be on the seventh and eighth unit pixels PU7 and PU8. In addition, the eighth ground region 288 may be only in the eighth unit pixel PU8. In an implementation, in the image sensor 200D of the present embodiment, one ground region 280 may be on one sub pixel SBP.

Figure 15:
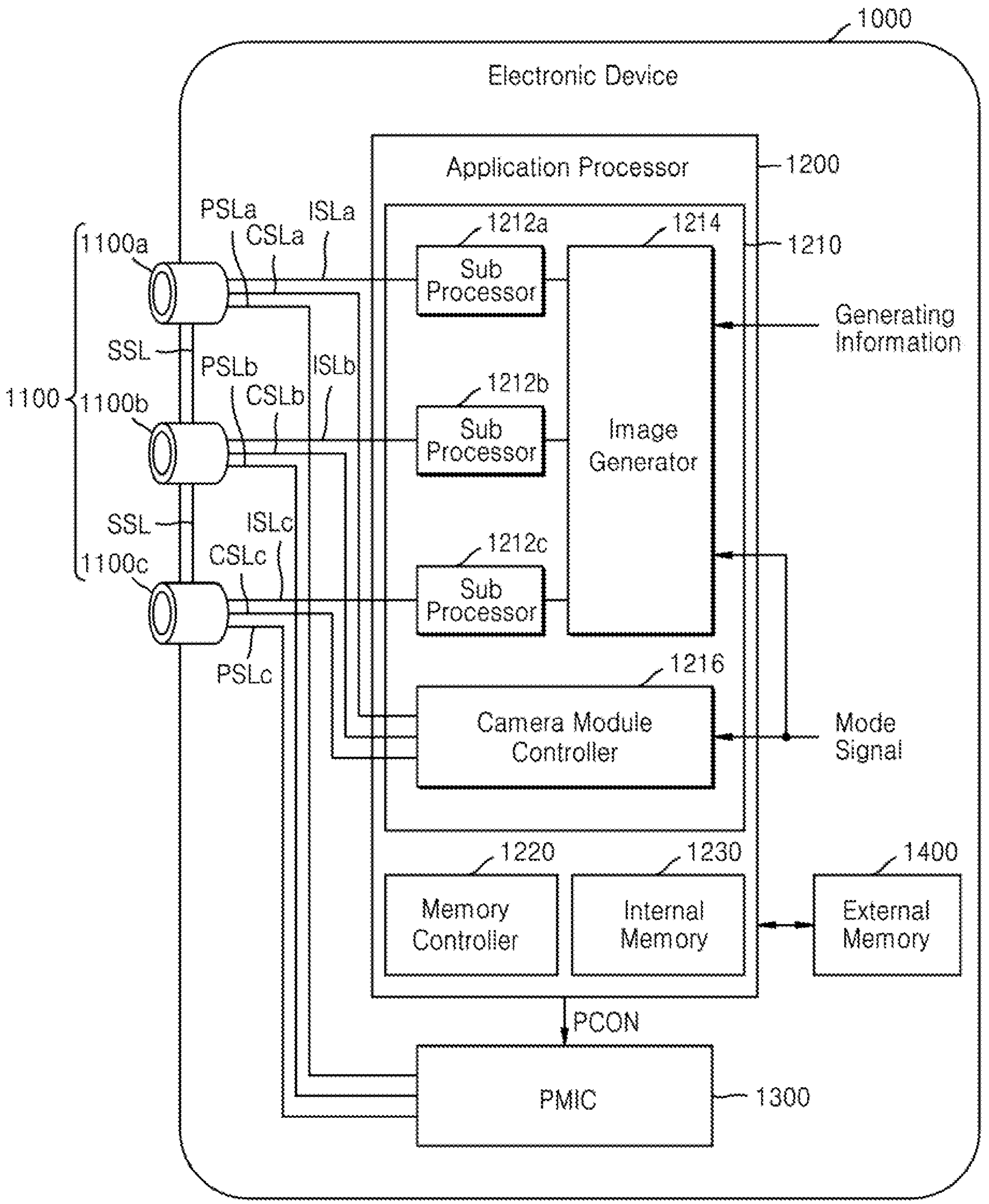
FIG. 15 is a block diagram showing an electronic device including a multi-camera module.
Figure 16:
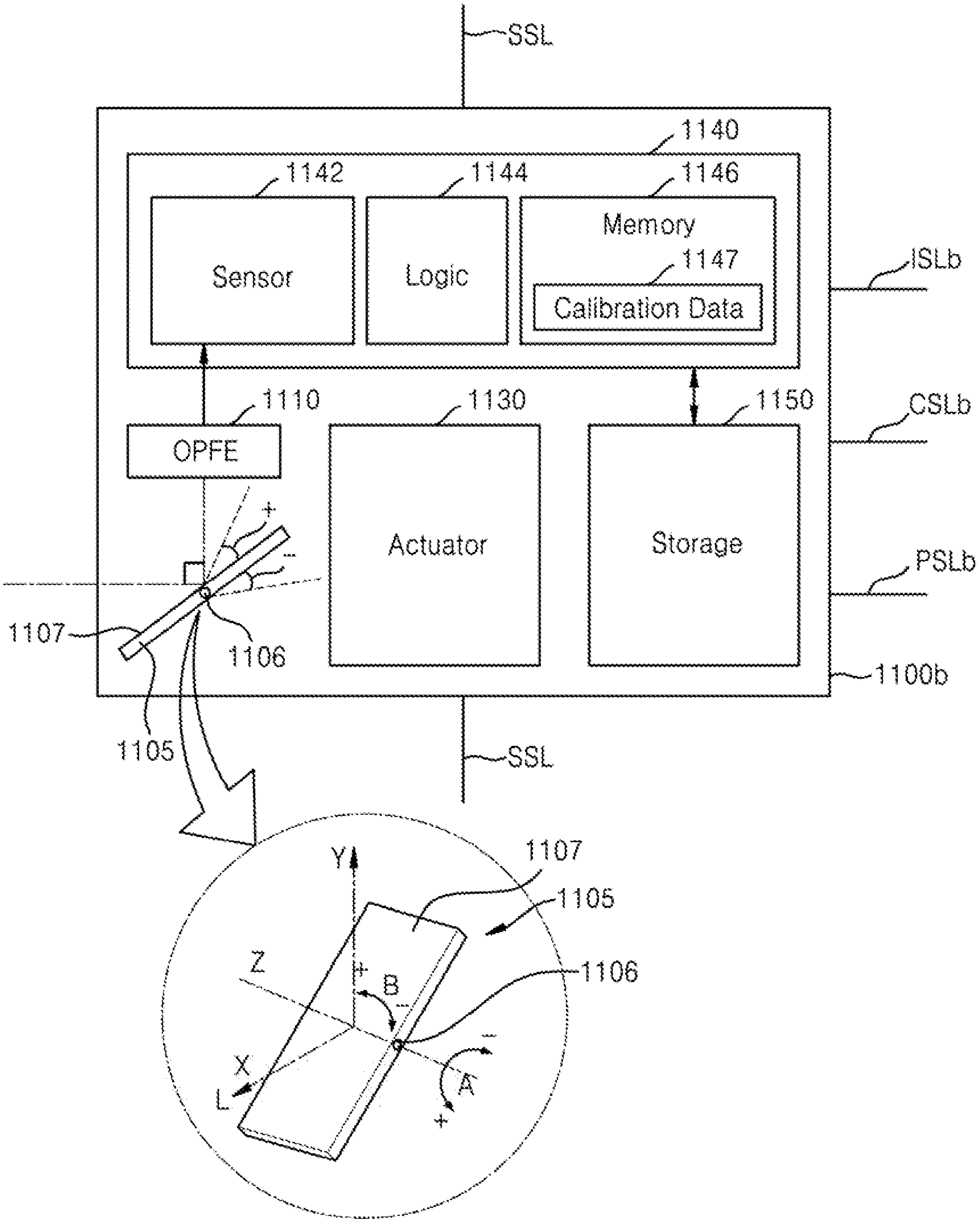
FIG. 16 is a detailed block diagram showing the camera module of FIG. 15.

FIG. 15 is a block diagram showing an electronic device including a multi-camera module. FIG. 16 is a detailed block diagram showing the camera module of FIG. 15. Referring to FIG. 15, an electronic device 1000 may include a camera module group 1100, an application processor 1200, a power management integrated circuit (PMIC) 1300, and an external memory 1400.

The camera module group 1100 may include a plurality of camera modules 1100*a*, 1100*b*, and 1100*c*. FIG. 15 illustrates an embodiment, in which the three camera modules 1100*a*, 1100*b*, and 1100*c* may be arranged. In some embodiments, the camera module group 1100 may be modified and embodied to include only two camera modules or n (where n is a natural number of 4 or more) camera modules. Referring to FIG. 16, the camera module 1100*b* may include a prism 1105, an optical path folding element (OPFE) 1110, an actuator 1130, an image sensing device 1140, and a storage 1150.

A detailed configuration of the camera module 1100*b* is to be described, but the descriptions below may be applied to the other camera modules 1100*a* and 1100*c* according to an embodiment in the same manner.

The prism 1105 may include a reflective surface 1107 of a light reflecting material and change a path of light L incident from the outside.

In some embodiments, the prism 1105 may change the path of the light L incident in a first direction (X direction) to a second direction (Y direction) perpendicular to the first direction (X direction). In addition, the prism 1105 may rotate the reflective surface 1107 of the light reflecting material to a direction A with respect to a center axis 1106, or change the path of the light L incident in the first direction (X direction) to the second direction (Y direction) by rotating the center axis 1106 to a direction B. In this case, the OPFE 1110 may also move to a third direction (Z direction) perpendicular to the first direction (X direction) and the second direction (Y direction).

In some embodiments, as illustrated, the maximum rotation angle of the prism 1105 in the direction A may be 15° or less in a positive (+) direction A, and may be greater than 15° in a negative (−) direction A.

In some embodiments, the prism 1105 may move within about 20°, between about 10° and about 20°, or between about 15° and about 20° in a positive (+) or (−) direction B, and in this regard, the angle may be moved at the same angle in the positive (+) or negative (−) direction B, or may be moved to an almost similar angle within a range of about 1°.

In some embodiments, the prism 1105 may move the reflective surface 1107 of the light reflecting material to the third direction (Z direction) in parallel with an extended direction of the center axis 1106.

The OPFE 1110 may include, e.g., an optical lens including m (where m is a natural number) groups. The m optical lenses may move in the second direction (Y direction) and change an optical zoom ratio of the camera module 1100*b*. In an implementation, when a basic optical zoom ratio of the camera module 1100*b* is set to be Z, and m optical lenses included in the OPFE 1110 may be moved, the optical zoom ratio of the camera module 1100*b* may be changed to an optical zoom ratio of 3Z, 5Z, or more.

The actuator 1130 may move the OPFE 1110 or the optical lens to a specific position. In an implementation, the actuator 1130 may adjust a location of the optical lens so that a sensor 1142 is at a focal length of the optical lens for accurate sensing.

The image sensing device 1140 may include the sensor 1142, a logic 1144, and a memory 1146. The sensor 1142 may sense an image of a sensing target by using the light L provided via the optical lens. The logic 1144 may control the overall operation of the camera module 1100*b*. In an implementation, the logic 1144 may control an operation of the camera module 1100*b* according to a control signal provided via a control signal line CSLb.

The memory 1146 may store information, such as calibration data 1147, required for the operation of the camera module 1100*b*. The calibration data 1147 may include information required by the camera module 1100*b* for generating image data by using the light L provided from the outside. The calibration data 1147 may include, e.g., information about a degree of rotation described above, information about a focal length, or information about an optical axis. When the camera module 1100*b* is implemented in a multi-state camera type in which the focal length varies depending on the position of the optical lens, the calibration data 1147 may include information about a focal length value for position (or for state) of the optical lens and auto-focusing.

The storage 1150 may store the image data sensed by the sensor 1142. The storage 1150 may be arranged outside the image sensing device 1140 and may be implemented by being stacked with a sensor chip constituting the image sensing device 1140. In some embodiments, the storage 1150 may be implemented as an electrically erasable programmable read-only memory (ROM) (EEPROM).

Referring to FIGS. 15 and 16 together, in some embodiments, each of the plurality of camera modules 1100*a*, 1100*b*, and 1100*c* may include the actuator 1130. Accordingly, each of the plurality of camera modules 1100*a*, 1100*b*, and 1100*c* may include the calibration data 1147 which is the same or different according to an operation of the actuator 1130 included therein.

In some embodiments, one camera module (e.g., 1100*b*) of the plurality of camera modules 1100*a*, 1100*b*, and 1100*c* may be a folded lens-type camera module including the prism 1105 and the OPFE 1110 described above, and the remaining camera modules (e.g., 1100*a* and 1100*c*) may be vertical type camera modules which do not include the prism 1105 and the OPFE 1110.

In some embodiments, one camera module (e.g., 1100*c*) of the plurality of camera modules 1100*a*, 1100*b*, and 1100*c* may be a vertical type depth camera that may extract depth information by using, e.g., infrared ray (1R). In this case, the application processor 1200 may merge image data provided by the depth camera with image data provided by another camera module (e.g., 1100*a* or 1100*b*) to generate a three-dimensional (3D) depth image.

In some embodiments, at least two camera modules (e.g., 1100*a* and 1100*b*) of the plurality of camera modules 1100*a*, 1100*b*, and 1100*c* may have different field of views (FOVs). In this case, e.g., optical lenses of at least two camera modules (e.g., 1100*a* and 1100*b*) of the plurality of camera modules 1100*a*, 1100*b*, and 1100*c* may be different from each other.

In addition, in some embodiments, the plurality of camera modules 1100*a*, 1100*b*, and 1100*c* may have different FOVs. In this case, the plurality of camera modules 1100*a*, 1100*b*, and 1100*c* may also have different optical lenses.

In some embodiments, the plurality of camera modules 1100*a*, 1100*b*, and 1100*c* may be arranged physically apart from each other. In other words, a sensing region of one sensor 1142 may not be divided and used by the plurality of camera modules 1100*a*, 1100*b*, and 1100*c*, but the sensor 1142 may be arranged independently inside each of the plurality of camera modules 1100*a*, 1100*b*, and 1100*c*.

Referring again to FIG. 15, the application processor 1200 may include an image processing device 1210, a memory controller 1220, and an internal memory 1230. The application processor 1200 may be implemented separately from the plurality of camera modules 1100*a*, 1100*b*, and 1100*c*. In an implementation, the application processor 1200 and the plurality of camera modules 1100*a*, 1100*b*, and 1100*c* may be separately implemented as separate semiconductor chips.

The image processing device 1210 may include a plurality of sub processors 1212*a*, 1212*b*, and 1212*c*, an image generator 1214, and a camera module controller 1216.

The image processing device 1210 may include the plurality of sub processors 1212*a*, 1212*b*, and 1212*c* having the number corresponding to the number of the plurality of camera modules 1100*a*, 1100*b*, and 1100*c*.

The image data generated by the plurality of camera modules 1100*a*, 1100*b*, and 1100*c* may be provided to the plurality of sub processors 1212*a*, 1212*b*, and 1212*c* respectively through image signal lines ISLa, ISLb, and ISLc which may be separated from each other. In an implementation, the image data generated by the camera module 1100*a* may be provided to the sub processor 1212*a* through the image signal line ISLa, the image data generated by the camera module 1100*b* may be provided to the sub processor 1212*b* through the image signal line ISLb, and the image data generated by the camera module 1100*c* may be provided to the sub processor 1212*c* through the image signal line ISLc. Transmission of the image data may be performed by using, e.g., a camera serial interface (CSI) based on the mobile industry processor interface (MIPI).

On the other hand, in some embodiments, one sub processor may also be arranged to correspond to a plurality of camera modules. In an implementation, the sub processor 1212*a* and the sub processor 1212*c* may not be implemented separately from each other as illustrated, but may be implemented as integrated into one sub processor, and the image data provided by the camera module 1100*a* and the camera module 1100*c* may be selected by a selection element (e.g., a multiplexer), and then provided to an integrated sub processor.

The image data provided to each of the plurality of sub processors 1212*a*, 1212*b*, and 1212*c* may be provided to the image generator 1214. The image generator 1214 may generate an output image by using the image data provided by each of the plurality of sub processors 1212*a*, 1212*b*, and 1212*c* according to image generation information or a mode signal.

In an implementation, the image generator 1214 may generate the output image by merging at least some of the image data generated by the plurality of camera modules 1100*a*, 1100*b*, and 1100*c* having different FOVs, according to the image generation information or the mode signal. In addition, the image generator 1214 may select at least one of the image data generated by the plurality of camera modules 1100*a*, 1100*b*, and 1100*c* having different FOVs, according to the image generation information or the mode signal to generate the output image.

In some embodiments, the image generation information may include a zoom signal or a zoom factor. In addition, in some embodiments, the mode signal may include, e.g., a signal based on a mode selected by a user.

When the image generation information includes the zoom signal (the zoom factor), and the plurality of camera modules 1100*a*, 1100*b*, and 1100*c* have different FOVs, the image generator 1214 may perform different operations according to a type of the zoom signal. In an implementation, when the zoom signal is a first signal, the image generator 1214 may merge the image data output by the camera module 1100*a* with the image data output by the camera module 1100*c*, and then generate the output image by using a merged image signal and the image data output by the camera module 1100*b* which may not have been used in the merging. When the zoom signal is a second signal different from the first signal, the image generator 1214 may not merge the image data but may select any one of the image data output by the plurality of camera modules 1100*a*, 1100*b*, and 1100*c* to generate the output image. A method of processing the image data may be modified and performed as necessary.

In some embodiments, the image generator 1214 may generate merged image data with an increased dynamic range, by receiving a plurality of image data having different exposure times from at least one of the plurality of sub processors 1212*a*, 1212*b*, and 1212*c*, and performing a high dynamic range (HDR) processing on the plurality of image data.

The camera module controller 1216 may provide a control signal to each of the plurality of camera modules 1100*a*, 1100*b*, and 1100*c*. The control signals generated by the camera module controller 1216 may be provided to the plurality of camera modules 1100*a*, 1100*b*, and 1100*c* respectively through the control signal lines CSLa, CSLb, and CSLc which may be separated from each other.

Any one of the plurality of camera modules 1100*a*, 1100*b*, and 1100*c* may be designated as a master camera module (e.g., 1100*b*) according to the image generation information including the zoom signal or the mode signal, and the other camera modules (e.g., 1100*a* and 1100*c*) may be designated as slave camera module. Such information may be included in the control signal and may be provided to the plurality of camera modules 1100*a*, 1100*b*, and 1100*c* respectively through the control signal lines CSL1, CSLb, and CSLc which may be separated from each other.

According to the zoom factor or an operation mode signal, camera modules operating as the master camera module and the slave camera module may change. In an implementation, when the FOV of the camera module 1100*a* is wider than the FOV of the camera module 1100*b*, and the zoom factor indicates a low zoom magnification, the camera module 1100*b* may operate as the master camera module, and the camera module 1100*a* may operate as the slave camera module. On the other hand, when the zoom factor indicates a high zoom magnification, the camera module 1100*a* may operate as the master camera module, and the camera module 1100*b* may operate as the slave camera module.

In some embodiments, the control signal provided by the camera module controller 1216 to each of the plurality of camera modules 1100*a*, 1100*b*, and 1100*c* may include a sync enable signal. In an implementation, when the camera module 1100*b* is the master camera module, and the camera modules 1100*a* and 1100*c* may be the slave camera modules, the camera module controller 1216 may transmit the sync enable signal to the camera module 1100*b*. The camera module 1100*b* having received the sync enable signal may generate a sync signal based on the received sync enable signal and provide the generated sync signal to the camera modules 1100*a* and 1100*c* via a sync signal line SSL. The camera module 1100*b* and the camera modules 1100*a* and 1100*c* may be synchronized to the sync signal and transmit the image data to the application processor 1200.

In some embodiments, the control signal provided by the camera module controller 1216 to the plurality of camera modules 1100*a*, 1100*b*, and 1100*c* may include mode information according to the mode signal. The plurality of camera modules 1100*a*, 1100*b*, and 1100*c* may operate in a first operation mode and a second operation mode with respect to a sensing speed based on the mode information.

The plurality of camera modules 1100*a*, 1100*b*, and 1100*c* may generate the image signal at a first speed (e.g., generate the image signal of a first frame rate), encode the generated image signal at a second speed greater than the first speed (e.g., encode the generated image signal of a second frame rate greater than the first frame rate), and transmit the encoded image signal to the application processor 1200, in the first operation mode.

The application processor 1200 may store the received image signal, that is, the encoded image signal, in the internal memory 1230 or in the external memory 1400 of the application processor 1200, and then, read and decode the encoded image signal from the internal memory 1230 or the external memory 1400, and display the image data generated based on the decoded image signal. In an implementation, a corresponding sub processor among the plurality of sub processors 1212*a*, 1212*b*, and 1212*c* of the image processing device 1210 may perform decoding, and in addition, perform an image processing operation on the decoded image signal.

The plurality of camera modules 1100*a*, 1100*b*, and 1100*c* may generate the image signal at a third speed less than the first speed (e.g., generate the image signal of a third frame rate less than the first frame rate), and transmit the image signal to the application processor 1200, in the second operation mode. The image signal provided to the application processor 1200 may be an unencoded signal. The application processor 1200 may perform the image processing operation on the received image signal or store the received image signal in the internal memory 1230 or the external memory 1400.

The PMIC 1300 may provide power, e.g., a power voltage, to each of the plurality of camera modules 1100*a*, 1100*b*, and 1100*c*. In an implementation, the PMIC 1300 may, under the control of the application processor 1200, provide a first power to the camera module 1100*a* through a power signal line PSLa, provide a second power to the camera module 1100*b* through a power signal line PSLb, and provide a third power to the camera module 1100*c* through a power signal line PSLc.

The PMIC 1300 may, in response to a power control signal PCON from the application processor 1200, generate power corresponding to each of the plurality of camera modules 1100$a$, 1100$b$, and 1100$c$, and in addition, adjust a level of the generated power. The power control signal PCON may include a power adjustment signal of each of the plurality of camera modules 1100$a$, 1100$b$, and 1100$c$ for each operation mode. In an implementation, the operation mode may include a low power mode, and in this regard, the power control signal PCON may include information about a camera module operating at the low power mode and a set power level. Levels of the power provided to the plurality of camera modules 1100$a$, 1100$b$, and 1100$c$ may be the same or different. In addition, the levels of the power may be dynamically changed.

Figure 17:
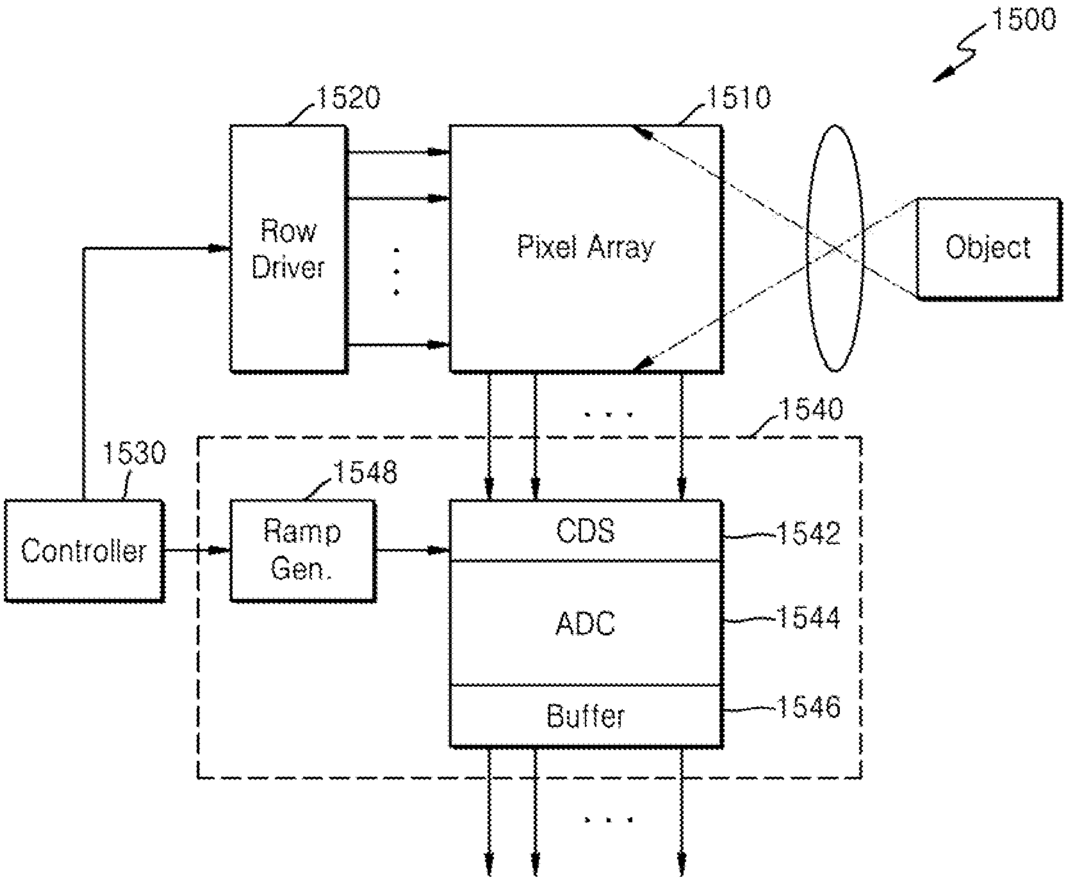
FIG. 17 is a block diagram showing the configuration of an image sensor according to an example embodiment.

FIG. 17 is a block diagram showing the configuration of an image sensor according to an example embodiment. Referring to FIG. 17, an image sensor 1500 may include a pixel array 1510, a controller 1530, a row driver 1520, and a pixel signal processor 1540.

The image sensor 1500 may include at least one of the image sensors 100A, 100B, 100C, 200A, and 200B described above. The pixel array 1510 may include a plurality of unit pixels arranged two-dimensionally, and each unit pixel may include a photoelectric conversion element. The photoelectric conversion element may absorb light to generate photo charges, and an electrical signal (or an output voltage) according to the generated photo charges may be provided to the pixel signal processor 1540 through a vertical signal line.

The unit pixels included in the pixel array 1510 may provide one output voltage at a time in row units, and accordingly, the unit pixels belonging to one row of the pixel array 1510 may be simultaneously activated by a selection signal output by the row driver 1520. The unit pixel belonging to the selected row may provide the output voltage corresponding to the absorbed light to an output line of a corresponding column.

The controller 1530 may control the row driver 1520 so that the pixel array 1510 absorbs light to accumulate the photo charges, or temporarily store the accumulated photo charges, and outputs an electrical signal corresponding to the stored photo charges to the outside thereof. In addition, the controller 1530 may control the pixel signal processor 1540 to measure the output voltage provided by the pixel array 1510.

The pixel signal processor 1540 may include a CDS 1542, an analog-to-digital converter (ADC) 1544, and a buffer 1546. The CDS 1542 may sample and hold the output voltage provided by the pixel array 1510.

The CDS 1542 may double-sample a specific noise level and a level of the generated output voltage and output a level corresponding to a difference therebetween. In addition, the CDS 1542 may receive ramp signals generated by a ramp generator 1548, compare the ramp signals to each other, and output a result of the comparison.

The ADC 1544 may convert an analog signal corresponding to the level received from the CDS 1542 into a digital signal. The buffer 1546 may latch the digital signal, and the latched digital signal may be sequentially output to the outside of the image sensor 1500 and transferred to an image processor.

By way of summation and review, to increase the area of the photodiode as miniaturization of a pixel size progresses, a shared pixel structure in which a plurality of pixels share transistors is applied to the image sensor. An image sensor having a shared pixel structure sharing floating diffusion regions through a silicon region of a substrate and reducing the length of a metal wiring connecting the floating diffusion regions, thereby minimizing fixed pattern noise while maintaining a high conversion gain. Other problems not mentioned in the above disclosure will be clearly understood by those skilled in the art from the following description.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made.

What is claimed is:

1. An image sensor, comprising:

a shared pixel including two sub pixels of a 1×2 structure and sharing at least one floating diffusion region on each of the two sub pixels through a metal wiring;

unit pixels surrounding the at least one floating diffusion region, within the shared pixel, separated from each other by front-side deep trench isolation, and each including a photodiode;

at least one transfer transistor adjacent to the at least one floating diffusion region and on each of the unit pixels;

a reset transistor and a selection transistor on a first unit pixel located in a first quadrant among the unit pixels;

a conversion gain transistor on a second unit pixel located in a second quadrant among the unit pixels; and a source follower transistor on a third unit pixel located in a third quadrant and a fourth unit pixel located in a fourth quadrant among the unit pixels, wherein:

the metal wiring connects the at least one floating diffusion region to a source region of the conversion gain transistor and a gate of the source follower transistor, and an acute angle is formed by the at least one floating diffusion region contacting the metal wiring.

2. The image sensor as claimed in claim 1, wherein the metal wiring includes:

a first metal wiring extending straight in a first direction in the source region of the conversion gain transistor, and a second metal wiring extending straight in a second direction crossing the first direction in the gate of the source follower transistor, and a right angle formed by contacting a first end of the first metal wiring with a second end of the second metal wiring.

3. The image sensor as claimed in claim 2, wherein the at least one floating diffusion region contacts the second metal wiring.

4. The image sensor as claimed in claim 3, wherein an angle about 45° is formed by the at least one floating diffusion region contacting the second metal wiring.

5. The image sensor as claimed in claim 3, wherein the at least one transfer transistor is oblique with respect to the second metal wiring.

6. The image sensor as claimed in claim 2, wherein the second metal wiring is along a boundary of the unit pixels.

7. The image sensor as claimed in claim 6, wherein the second metal wiring is connected to a center of the gate of the source follower transistor.

8. The image sensor as claimed in claim 1, wherein at least a part of the metal wiring overlaps the front-side deep trench isolation in a vertical direction.

9. The image sensor as claimed in claim 1, wherein a ground region is on each of the first unit pixel to the fourth unit pixel.

10. The image sensor as claimed in claim 1, wherein:
a ground region is on each of the second unit pixel and the third unit pixel, and
the ground region is not on the first unit pixel and the fourth unit pixel.

11. An image sensor, comprising:
a shared pixel including two sub pixels of a 1×2 structure, each of the two sub pixels sharing, through a metal wiring, at least one floating diffusion region thereon;
unit pixels surrounding the at least one floating diffusion region, within the shared pixel, separated from each other by front-side deep trench isolation, and each including a photodiode;
at least one transfer transistor adjacent to the at least one floating diffusion region and on each of the unit pixels;
a first source follower transistor on a first unit pixel located in a first quadrant among the unit pixels;
a conversion gain transistor on a second unit pixel located in a second quadrant among the unit pixels;
a reset transistor and a selection transistor on a third unit pixel located in a third quadrant among the unit pixels; and
a second source follower transistor on a fourth unit pixel located in a fourth quadrant among the unit pixels, wherein:
the metal wiring connects the at least one floating diffusion region to a source region of the conversion gain transistor and a gate of the first source follower transistor, and
a right angle is formed by the at least one floating diffusion region contacting the metal wiring.

12. The image sensor as claimed in claim 11, wherein the metal wiring includes:
a first metal wiring formed straight in a first direction from the source region of the conversion gain transistor to the gate of the first source follower transistor, and
a second metal wiring extending straight in a second direction crossing the first direction, and
the at least one floating diffusion region is connected to a first end and a second end of the second metal wiring.

13. The image sensor as claimed in claim 12, wherein the at least one transfer transistor is in parallel with the second metal wiring.

14. The image sensor as claimed in claim 11, wherein at least a part of the metal wiring overlaps the front-side deep trench isolation in a vertical direction.

15. The image sensor as claimed in claim 14, wherein:
the metal wiring is a cross shape, and
a center point of the cross shape coincides with a central point of the shared pixel.

16. An image sensor, comprising:
a shared pixel including four sub pixels of a 2×2 structure, each of the four sub pixels sharing, through a metal wiring, at least one floating diffusion region thereon;
unit pixels surrounding the at least one floating diffusion region, within the shared pixel, separated from each other by front-side deep trench isolation, and each including a photodiode, wherein four unit pixels are in a first row and four unit pixels are in a second row;
at least one transfer transistor adjacent to the at least one floating diffusion region and on each of the unit pixels;
a conversion gain transistor on one unit pixel of the first row among the unit pixels; and
a source follower transistor on two unit pixels of the second row among the unit pixels, wherein:
the metal wiring connects the at least one floating diffusion region to a source region of the conversion gain transistor and a gate of the source follower transistor, and
an acute angle is formed by the at least one floating diffusion region contacting the metal wiring.

17. The image sensor as claimed in claim 16, wherein:
the metal wiring includes:
a first metal wiring extending straight in a first direction in the source region of the conversion gain transistor,
a second metal wiring extending straight in a second direction crossing the first direction in the gate of the source follower transistor,
a third metal wiring extending straight in the first direction near a center of the second metal wiring, and
a fourth metal wiring extending straight in the second direction at an end of the third metal wiring, and
the first metal wiring to the fourth metal wiring are electrically connected to each other.

18. The image sensor as claimed in claim 17, wherein the at least one floating diffusion region contacts the second metal wiring and the fourth metal wiring.

19. The image sensor as claimed in claim 17, wherein an angle about 45° is formed by the at least one floating diffusion region contacting the second metal wiring and the fourth metal wiring.

20. The image sensor as claimed in claim 17, wherein the at least one transfer transistor is oblique with respect to the second metal wiring and the fourth metal wiring.

* * * * *